United States Patent [19]
Witte

[11] Patent Number: 6,162,007
[45] Date of Patent: Dec. 19, 2000

[54] APPARATUS FOR FEEDING ELECTRONIC COMPONENT TAPE

[76] Inventor: Stefan Witte, 250 Red Oak La., Alpharetta, Ga. 30004

[21] Appl. No.: 09/231,558

[22] Filed: Jan. 14, 1999

[51] Int. Cl.[7] .......................... H05K 13/02; B65H 20/22
[52] U.S. Cl. ..................... 414/416; 414/222.01; 221/25; 221/72; 221/211
[58] Field of Search .................................. 414/416, 403, 414/222.01; 156/247; 294/64.1, 907; 901/46; 221/25, 71, 72, 211

[56] References Cited

U.S. PATENT DOCUMENTS

| | | |
|---|---|---|
| 2,748,388 | 6/1956 | Cardani . |
| 4,208,648 | 6/1980 | Naumann ............................. 901/46 X |
| 4,437,232 | 3/1984 | Araki et al. ............................. 29/740 |
| 4,438,559 | 3/1984 | Asai et al. ............................. 29/740 |
| 4,557,659 | 12/1985 | Scaglia ............................. 294/64.1 X |
| 4,586,670 | 5/1986 | Vancelette et al. ..................... 242/55 |
| 4,606,117 | 8/1986 | Takahashi et al. . |
| 4,610,083 | 9/1986 | Campisi et al. ........................ 29/832 |
| 4,621,331 | 11/1986 | Iwata .............................. 294/907 X |
| 4,631,816 | 12/1986 | Fujita et al. ............................ 29/740 |
| 4,631,897 | 12/1986 | Slavicek . |
| 4,653,664 | 3/1987 | Hineno et al. ............................ 221/3 |
| 4,709,342 | 11/1987 | Hosoda et al. ....................... 901/46 X |
| 4,740,136 | 4/1988 | Asai et al. . |
| 4,768,915 | 9/1988 | Fujioka ............................ 414/416 |
| 4,810,154 | 3/1989 | Klemmer et al. ................... 414/416 X |
| 4,820,369 | 4/1989 | Kubo . |
| 5,017,078 | 5/1991 | Ingwersen et al. . |
| 5,020,959 | 6/1991 | Soth . |
| 5,191,693 | 3/1993 | Umetsu .............................. 414/416 X |
| 5,299,902 | 4/1994 | Fujiwara et al. . |
| 5,310,301 | 5/1994 | Aono ...................................... 414/416 |
| 5,323,528 | 6/1994 | Baker ..................................... 29/721 |
| 5,419,802 | 5/1995 | Nakatsuka et al. ................. 414/416 X |
| 5,531,859 | 7/1996 | Lee et al. . |
| 5,562,384 | 10/1996 | Alvite et al. . |
| 5,695,309 | 12/1997 | Kondo et al. . |
| 5,725,140 | 3/1998 | Weber et al. ....................... 414/416 X |
| 5,762,754 | 6/1998 | Kondo et al. . |

FOREIGN PATENT DOCUMENTS

| | | | |
|---|---|---|---|
| 61-229717 | 10/1986 | Japan | ..................................... 414/416 |

*Primary Examiner*—Robert P. Olszewski
*Assistant Examiner*—Gerald J. O'Connor

[57] ABSTRACT

The invented apparatus includes at least one feeder and a base unit for successively advancing one or more tapes containing electronic components so that such components can be extracted by a pick-up device for installation in circuit boards, for example. The feeder can include a body, a sprocket, a slider, and a one-way drive member. The body defines a guide through which a tape extends, and its sprocket is rotatably mounted in the body so that its teeth engage with and advance the tape if the sprocket is rotated. The drive member is mounted to the slider, and the slider is mounted to reciprocate in the body. The slider moves the drive member into contact with sprocket to rotate the sprocket by an amount sufficient to advance the tape by one interval to expose the next electronic component for extraction from the feeder. The apparatus' base unit can include at least one sensor, a controller, and at least one solenoid unit. The sensor generates a signal to indicate the release of pressure on the feeder as a pick-up device moves away from the feeder to extract an electronic component from the tape. After a predetermined time delay sufficient to permit the pick-up device to move clear of the feeder, the controller generates controls signals supplied to at least one solenoid unit to reciprocate the feeder's slider to advance the tape. The feeder can also include a mechanism that compacts the cover tape removed from a carrier tape for electronic components, into a string-like configuration for ready disposal, and a mechanism which prevents an electronic component from escaping the feeder before extraction by the pick-up device. The invention also includes related feeders and methods.

42 Claims, 14 Drawing Sheets

APPARATUS FOR FEEDING ELECTRONIC COMPONENT TAPE

FIELD OF THE INVENTION

1. Background of the Invention

The subject invention is related to mechanisms used in surface mount machinery to serially feed tapes containing electronic components to pick-up devices. The pick-up devices extract electronic components from the tapes and install such components in circuit boards in the automated production thereof.

2. Description of the Related Art

In the electronic circuit board assembly industry, electronic components are typically packaged in tapes wound on reels. The reels are sold commercially to assemblers, and typically contain hundreds to approximately one-thousand electronic components per reel. Such reels are loaded in surface mount machines whose feeder mechanisms unwind the tapes and serially extract the electronic components for installation in circuit boards. Because circuit boards often contain many different electronic components, numerous tapes and associated surface mount machinery are often used together in a production line to assemble circuit boards of a particular type.

FIG. 1 shows an example of an electronic component tape 1 which is typical of those commercially available to assemblers in the surface mount industry. The tape 1 includes a carrier tape 2 and a cover tape 3. The carrier tape 2 is usually made of paper, molded or stamped plastic or metal such as aluminum, and the cover tape 3 is typically composed of plastic. The carrier tape 2 defines recesses 4 positioned at regularly spaced locations along the length of the tape 1. The recesses 4 are sized to permit electronic components 5 to be positioned therein. The cover tape 3 is normally positioned on the carrier tape 2 to enclose the electronic components 5 between the carrier tape and the cover tape. The cover tape 3 typically has an adhesive side so that it will adhere to the carrier tape 2. However, the adhesive is not so strong as to prohibit the cover tape 3 from being removed from the carrier tape 2 by the surface mount machinery to expose the electronic components 5 for removal and installation in circuit boards.

After loading a reel in surface mount machinery, the machinery's feeder mechanism unwinds the tape 1 from its reel and removes the cover tape 3 to expose electronic components 5 for removal by a pick-up device which usually employs suction to capture the components one-by-one for installation into respective circuit boards. Previous surface mount machinery typically have mechanisms which wind the cover tape 3 removed from the carrier tape 2 onto a secondary reel for disposal. Representative examples of this arrangement are shown in U.S. Pat. No. 4,606,117 issued Aug. 19, 1986 to Takahashi et al., U.S. Pat. No. 4,740,136 issued Apr. 26, 1998 to Asai et al., U.S. Pat. No. 5,531,859 issued Jul. 2, 1996 to Lee et al., U.S. Pat. No. 5,695,309 issued Dec. 9, 1997 to Kondo et al., and U.S. Pat. No. 5,762,754 issued Jun. 9, 1998, for example. While the winding of the cover tape 3 onto a secondary reel is advantageous from the standpoint of confining the cover tape 3 removed from the carrier tape 2 so that it cannot interfere with the surface mount machinery, it is disadvantageous from the standpoint that the complexity of the surface mount machinery is greatly increased by the use of the secondary reel which must be rotated by the machinery in synchronism with the feeder and component removal mechanisms of the surface mount machinery to wind the cover tape 3 onto the secondary reel after removal from the carrier tape 2. It would be advantageous to provide a tape feeder which can dispose of the cover tape 3 in a manner which ensures that it will not interfere with the surface mount machinery. One object of the invention is to provide and apparatus and method which achieve this advantage.

Another problem related to this invention is the fact that most commercially-available tape feeder and cover tape disposal mechanisms are relatively complex and expensive, costing on the order of a thousand dollars or more for a single feeder or tape disposal mechanism at current prices. Such complexity and cost for the feeder mechanism adds significantly to the overall cost of the surface mount machinery. In addition, the significant expense of such mechanisms generally necessitates that such mechanisms must be repaired when they malfunction or wear out. Repair requires that the feeder mechanisms be taken off-line for significant periods of time. It would be desirable to provide feeder and cover tape mechanisms which are highly effective in feeding the tape 1 and in removing and disposing of the cover tape 3, and yet which has a configuration that is sufficiently inexpensive to permit a malfunctioning or worn-out feeder mechanism to be disposed of and readily replaced with relatively little expense or down-time. In addition, it would be desirable to provide a feeder mechanism that is universal, that is, that can be used with drive mechanisms adapted for different types of surface mount machinery. Other objects of this invention are to provide an apparatus and method which attain these advantages.

SUMMARY OF THE INVENTION

This invention overcomes the above-stated problems, and achieves the above-stated advantages and objects. The invented apparatus serially feeds a tape that holds electronic components stored at spaced intervals along the tape's length. The invented apparatus can be used to dispense the electronic elements for extraction by a pick-up device which installs the electronic components in respective circuit boards moving in a production line, for example. The tape includes a carrier tape which defines spaced recesses or pockets for containing the electronic components, and preferably has a cover tape that is removably adhered to the carrier tape to prevent the electronic components from escaping the tape before they are extracted from the tape by the pick-up device.

In a preferred embodiment, the apparatus basically includes at least one feeder and a base unit. Each feeder can include a body, a sprocket, a slider, and a drive member. The body defines a guide for the tape for its advancement through the feeder. The body can include a cover positioned over the body's guide to enclose the carrier tape in the guide, with the cover defining a window through which the pick-up device extracts electronic components. The sprocket is rotatably mounted in the body, and has teeth that extend into perforations defined in the carrier tape so that the tape can be forced to advance through the body's guide by rotation of the sprocket. The slider is slidably mounted to reciprocate in the body, and the drive member is mounted to the slider. As the slider is driven to reciprocate by the base unit, the drive member engages with and rotates the sprocket by an amount sufficient to advance the tape by one interval to expose the next electronic component for extraction from the feeder by the pick-up device. The feeder can also include a cover plate that is coupled to the slider and positioned over a portion of the carrier tape from which the cover tape has been removed. As the slider is driven from its home to its advanced position by the base unit, the cover plate moves with the slider to a position covering the pick-up window to prevent the electronic component from escaping the carrier tape through motion or vibration caused by the slider and drive member as they are forced by the base unit to engage with and rotate the sprocket to advance the tape. Also, the feeder can include a resilient member mounted between the body and the slider, which biases the slider toward its home position.

The feeder can include a mechanism that compacts and guides the cover tape removed from a carrier tape so that it can be readily disposed of without tangling or interfering with the pick-up device or other parts of the surface mount machinery. In one embodiment of such mechanism, the feeder includes a removal member and a wheel. The removal member is mounted to the body and extends in a direction transverse to the direction in which the tape moves through the body. As the tape is driven to advance through the feeder, the removal member removes the cover tape from the carrier tape to expose electronic components for extraction by the pick-up device. The removal member can also fold and guide the cover tape to the wheel. More specifically, the cover tape advances from the removal member through a channel defined in the feeder head, and into a tapered or V-shaped groove defined about the circumferential edge of the wheel. The wheel is rotatably mounted to the body, and is preferably fixed to the sprocket so that the wheel and sprocket rotate about a common axis. Because the groove is tapered, the cover tape compacts as it turns about the wheel so that the cover tape assumes a relatively thin, string-like configuration. The wheel can define angled teeth about its periphery that are positioned on opposite sides of the groove. The wheel's teeth urge the cover tape to advance as the wheel rotates with the sprocket, and also force the cover tape into the bottom of the tapered groove for compaction as the sprocket and wheel are driven via the one-way drive member, the slider and the base unit. After advancing beyond the wheel, the compacted cover tape moves between an underside of the carrier tape and the guide, and is advanced from the feeder along with the carrier tape to exit the feeder for disposal. The cover tape is thus relatively confined after removal from the carrier tape and is therefore restricted from interfering with the surface mount machinery.

In a second embodiment of the mechanism for compacting the cover tape, the feeder can include a removal member, a turning member, a wheel, a roller, and a lever arm. The removal member is mounted to the body and extends in a direction transverse to the direction of movement of the tape in the body. The removal member removes the cover tape from the carrier tape and folds the cover tape, as the tape is driven by the sprocket to advance through the body. The turning member is mounted to the body, and receives the cover tape from the removal member. The turning member defines a groove about its periphery to guide and compact the cover tape. The wheel, roller, and lever arm serve to compress the cover tape received from the turning member onto the carrier tape from the upper and lower sides thereof so that the cover tape adheres to the carrier tape and cannot escape to tangle or interfere with the surface mount machinery. The wheel is rotatably mounted to the body, and is preferably fixedly mounted to the sprocket so that the wheel has a common axis of rotation with the sprocket. The lever arm has a first end rotatably mounted to the body or an axle extending between the sprocket and wheel, preferably so that the lever arm pivots about approximately the same axis about which the sprocket and wheel rotate. The roller is rotatably mounted to the lever arm's second end, and extends approximately perpendicularly therefrom. The cover tape from the turning member passes between and is compressed by the wheel and the roller against the carrier tape so that the cover tape is fixed to the carrier tape for disposal. The wheel and the roller can each be configured to define two differently-sized circumferential surfaces. One pair of surfaces of the wheel and the roller contact one another so that the roller rotates with the wheel when the wheel is driven to rotate. The other pair of surfaces of the wheel and the roller compress the cover tape onto the carrier tape from opposite sides thereof. The relative sizing of the contacting surfaces of the wheel and the roller causes the roller to rotate at an angular velocity faster than the feed rate of the carrier tape through the feeder. The roller therefore stretches the cover tape so that the cover tape becomes relatively thin and compacted for ready disposal thereof.

The base unit is adapted to receive at least one feeder, preferably so as to permit the feeder to be readily removed therefrom, and drives the feeder's slider to advance its tape after a pick-up device has extracted an electronic component from the tape. More specifically, the base unit can detect whether an electronic component has been extracted from the tape in a feeder, and if so, the base unit drives the feeder to advance the tape to position the next electronic component in the tape for extraction by the pick-up device. In a preferred embodiment, the base unit can include at least one sensor, a controller, at least one solenoid unit, and optionally one or more limit switches. The base unit optionally can also include a housing into or onto which the sensor(s), controller, solenoid unit(s) and limit switch(es) are mounted for support. Preferably, the base unit includes a first solenoid unit, and at least one second solenoid unit. The second solenoid unit(s) is mounted to the first solenoid unit's armature so that the second solenoid unit's armature reciprocates along a direction that is transverse to the direction of reciprocation of the first solenoid unit's armature. The first solenoid unit's armature reciprocates in a direction that is approximately parallel to the direction in which the feeder's slider(s) reciprocates upon positioning the feeder on the base unit. For each feeder accommodated by the base unit, the base unit preferably includes one sensor and one second solenoid unit. The base unit can also include at least one post, and preferably two spaced posts, provided for each feeder. The post(s) are situated in proximity to the sensor and second solenoid unit for each feeder. The posts are received by a bore(s) defined in the feeder upon positioning the feeder on the base unit so that the feeder is free to slide thereon. The sensor is preferably implemented as a pressure switch, and is positioned along with the second solenoid unit underneath a respective feeder positioned on the base unit. The controller is electrically coupled to receive the sensor's signal, and is also electrically coupled to output control signals to the first and second solenoid units. As a pick-up device moves into close proximity with a feeder to extract an electronic component from the feeder's tape and exerts pressure against the feeder, the feeder slides to a degree on the posts and is forced against the sensor underneath the feeder. The pressure exerted against the sensor by the feeder causes the sensor to activate a signal to indicate that the pick-up device is in close proximity to the feeder. The controller is coupled to receive the signal from the sensor, and generates a control signal to cause the second solenoid unit to extend its armature into a groove defined in the feeder's slider. As the pick-up device moves away from the feeder to extract an electronic component from the tape, pressure exerted against the sensor is released so that the sensor deactivates its signal to indicate to the controller that the pick-up device is no longer in close proximity with the feeder. In response to deactivation of the sensor's signal, the controller waits a predetermined period of time sufficient to permit the pick-up device to move clear of the feeder, and then activates a control signal to cause the first solenoid unit to move its armature from its extended position to its retracted position and back again. This action causes the feeder's slider to engage the drive member with the sprocket to rotate same by an amount sufficient to advance the tape by one interval to expose the next electronic component for removal by the pick-up device. Optionally, the controller can be electrically coupled to a first limit switch positioned to detect the presence of the first solenoid unit's armature at its extended position, so that as the first solenoid unit returns to its extended position, the limit switch activates its signal which is supplied to the controller. In response to the first limit switch's signal, the controller can generate a control signal supplied to the second solenoid unit(s) to cause it to retract its armature. Also optional, the base unit can include a second limit switch positioned to detect the presence of the first solenoid unit's armature in its retracted position, and activates a signal indicative thereof. The second limit switch is electrically coupled to its signal to the controller. In response to the activation of the second limit switch's signal, the controller deactivates its control signal to the first solenoid unit to cause the first solenoid unit's armature to return to its extended position. The controller can output its control signals and/or signals received from the limit switches for use by an external processor that is not a part of the invented apparatus, for use in controlling surface mount machinery or fault diagnosis.

Advantageously, because the first solenoid unit can be used to drive a plurality of feeders as opposed to using separate mechanisms to move each feeder, redundancy as compared to previous feeder mechanisms is greatly reduced to achieve significant savings in the complexity and cost of the apparatus over previous machines. Moreover, the ability of the feeders to effectively dispose of the cover tape and prevent such cover tape from interfering with the surface mount machinery in a relatively simplified manner is a great advantage relative to previous devices. Further, it should be appreciated that the feeders themselves are of relatively simple and uncomplicated construction, and are therefore readily manufactured and used. In addition, because the feeder units of the invented apparatus are relatively inexpensive, the feeder units can be disposed of if they malfunction or wear out, to eliminate the need for costly and time-consuming repair and servicing of such feeders.

A first method of this invention can include a step of removing a cover tape from a carrier tape, and includes a step of compacting a cover tape removed from a carrier tape containing electronic components into a string-like configuration for disposal. In one embodiment, the compacting step can be performed by advancing the cover tape into a tapered groove defined in a wheel or turning member to compact the cover tape into the string-like configuration for disposal. The compacting step can also include urging the cover tape toward the bottom of the tapered groove and to advance with angled teeth defined in the wheel on opposite sides of the tapered groove. The method can also include a step of stretching the cover tape, which can be performed by advancing the cover tape between a wheel and a roller which has an angular velocity that is faster than the feed rate of the carrier tape so that the cover tape is stretched as it moves in contact with the roller. The method can also include compressing the cover tape onto the carrier tape, which can be performed by advancing the cover tape between a wheel and a roller which compress the cover tape against the carrier tape from opposing sides thereof.

A second invented method includes steps of sensing a release of pressure against a feeder as a pick-up device moves away from the feeder to extract an electronic component from a tape guided by the feeder, and advancing the tape via the feeder by one interval to position the next electronic component for removal by the pick-up device, based on the sensing step. The sensing and advancing steps can be repeatedly performed. The second method can include a step of removing an interval of the cover tape from the carrier tape to expose an electronic component, based on the advancing step. The second method can also include a step of compacting an interval of the cover tape removed from the carrier tape into a string-like configuration, based on the advancing step. Moreover, the second method can include a step of compressing the cover tape onto the carrier tape, based on the advancing step. In addition, the second method can include a step of stretching the cover tape, based on the advancing step. The above steps can be repeatedly performed.

These together with other features and advantages, which will become subsequently apparent, reside in the details of construction and operation as more fully hereinafter described and claimed, reference being made to the accompanying drawings, forming a part hereof wherein like numerals refer to like parts throughout the several views.

DESCRIPTION OF THE PREFERRED EMBODIMENTS

As used herein, the words "attached", "mounted" and "coupled" refer to joining two elements together, either directly or indirectly through other elements positioned intermediately to the joined elements, and either in a fixed, immovable manner or in a manner that permits relative movement between the joined elements. The word "fixed" means that two elements are joined together so that they are immovable relative to one another. Two elements can be "attached", "mounted", "coupled" or "fixed" together through the use of adhesive, welding, heat fusing, or mechanical devices such as screws, rods, pins, nails, rivets, nuts and bolts or other devices and techniques. The words "electrically coupled" refer to the coupling of two elements so as to conduct electric signals therebetween by conductive wire, cable or through other electromagnetic transmission devices.

1. First Embodiment of Feeder

Referring to FIGS. 2A–2H, a first embodiment of a feeder 10 of the invented apparatus 100 is shown. The feeder 10, like the other elements of the apparatus 100 yet to be described in detail, is preferably composed of molded or machined plastic material such as polycarbonate, vinyl, polyvinyl chloride (PVC) or other plastics. The feeder 10 as well as the other elements of the apparatus, can also generally be formed of molded, machined, cast or stamped metal or alloy materials including aluminum, steel, tin, and/or copper, for example, although the use of plastic or metal materials does not exclude the use of other suitable materials for the apparatus 100. The feeder 10 and other elements of the apparatus 100 can be either integrally formed or formed of separate pieces that can be joined together with an adhesive, welding, heat fusing, or mechanical fasteners such as screws, nuts, bolts, pins, rivets, etc., or through other techniques or devices as will readily occur to those of ordinary skill in this art.

Figure 1:
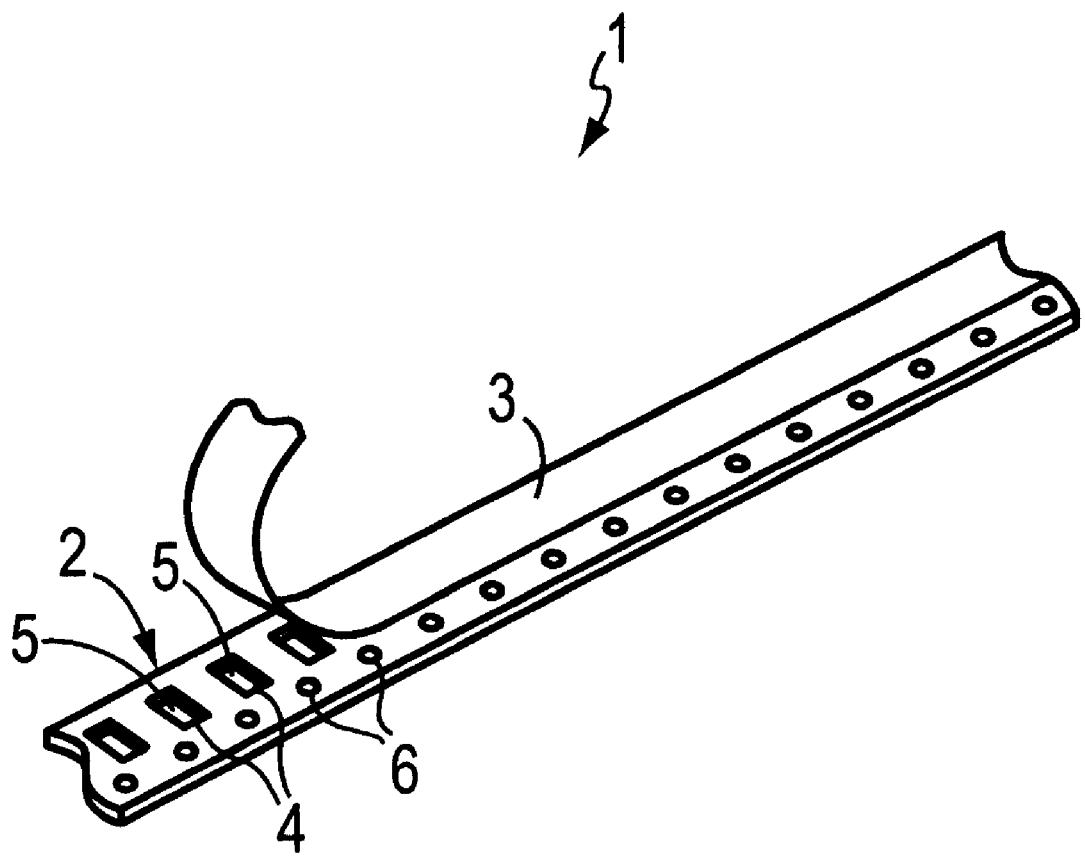
FIG. 1 is a perspective view of a portion of a tape for holding electronic components which can be used in the invented apparatus.

The feeder 10 includes a body 11 which is essentially a block or frame in which the elements of the feeder are mounted. On its top surface in FIG. 2A, the body 11 defines a guide 12 for receiving a tape 1 of the type shown in FIG. 1, for example. The guide 12 constrains the tape 1 to move in only the direction of advancement of the tape through the feeder 10. The tape 1 is not present in the feeder 10 of FIG. 2A so that the guide 12 can be more readily seen, but the tape 1 and the direction of its movement through the guide 12 are shown in FIGS. 2B and 2C. The guide 12 basically includes two opposing, parallel side surfaces, and a bottom surface that extends between the two side surfaces. The height of the guide's side surfaces above the bottom surface of the guide and the spacing of the guide's side surfaces are slightly larger than the thickness and width of the tape 1 with which the feeder 10 is to be used. Standard tape sizes are from two-tenths (0.2) to one (1.0) millimeter in thickness and eight (8), twelve (12), sixteen (16), twenty-four (24), thirty-two (32), forty-four (44) or fifty-six (56) millimeters wide. The feeder 10 is most preferred for use with tape sizes of from eight (8), twelve (12), sixteen (16), although the feeder 10 can be adapted for the other tape sizes. The feeder 10 also includes a cover 13 which partially encloses the top of the guide 12 to prevent the tape 1 from escaping the feeder 10 upon insertion into the guide 12 and through the feeder 10.

The feeder 10 also includes a sprocket 14 which is rotatably mounted to the body 11. The sprocket 14 is approximately disk-like or circular in shape and defines teeth that are spaced at regular angular increments about the circumferential or peripheral edge of the sprocket. The sprocket 14 is positioned in the feeder 10 so that its circumferential edge is approximately tangent to the bottom surface of the guide 12 and so that its teeth extend slightly above the level of the bottom surface so that the teeth of the sprocket 14 extend through perforations defined in the tape 1 to engage with and advance the tape. The feeder 10 also includes a slider 15. The slider 15 is slidably mounted in the body 11 so that it can reciprocate as shown by the direction arrow in FIG. 2A between a home position (i.e., the position of the slider 15 in FIG. 2A) and an advanced position in which the slider 15 would be closer to the front or right end of the feeder 10 in FIG. 2A. The slider 15 is positioned and mounted in the body 11 so as to permit its reciprocation in a direction that is at least approximately tangential to the circumferential edge of the sprocket 14. The feeder 10 includes a bolt 16 and lock-washer 17, for example, to mount the slider 15 to the body 11 so that the slider can reciprocate therein. More specifically, the bolt 16 extends through the body 11 and through a slot 18 defined in the slider 15, and the lock-washer 17 is attached to the end of the bolt 16 to secure the bolt in the feeder 10. The slot 18 is elongated along the direction of reciprocation of the slider 15 to permit the bolt 16 to move laterally therein as the slider is driven to reciprocate by the base unit.

Figure 2A:
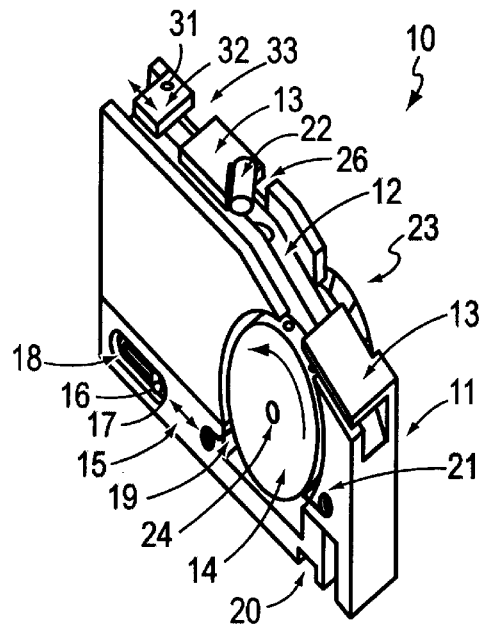
FIGS. 2A–2C are perspective views of a first embodiment of a feeder of the invented apparatus.
Figure 2B:
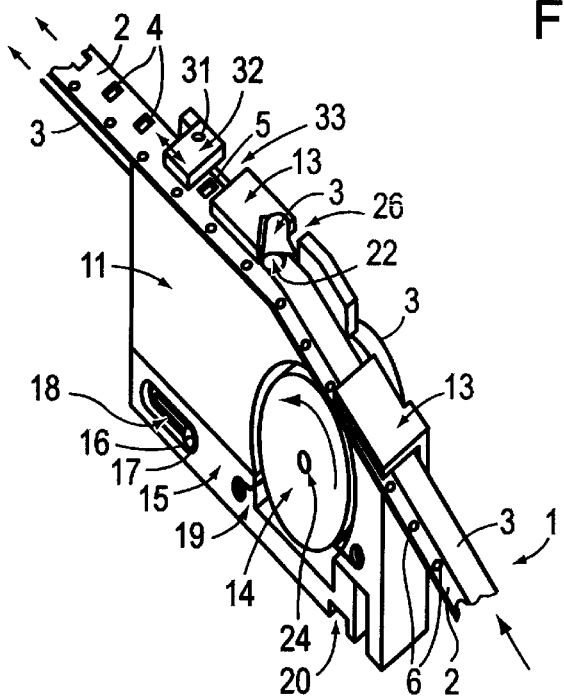
Figure 2C:
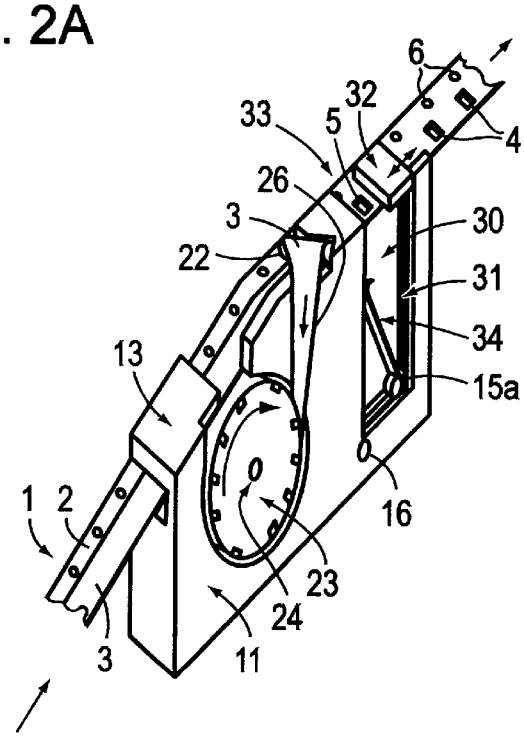

The feeder 10 also includes a drive member 19 that is mounted to the slider 15, and that serves to rotate the sprocket 14 if the slider is moved from its home to its advanced position (i.e., from left to right in FIG. 2A), but which does not rotate the sprocket 14 if the slider is moved from its advanced position to its home position (i.e., from right to left in FIG. 2A). The drive member 19 can be implemented with numerous devices, the most presently preferred of which is a curved resilient metal leaf spring. The drive member 19 has one end mounted to the slider 15, and extends from the slider so that its curvature is in an opposite sense to the sprocket's circumferential edge rather than parallel therewith. The drive member 19 is also positioned so that its free end is at least approximately tangential to the sprocket's edge. As the slider 15 is moved from its home position to its advanced position, the drive member 19 engages a tooth of the sprocket 14 and rotates the sprocket in the counterclockwise direction in FIG. 2A. On the other hand, the relative positioning of the drive member 19 with respect to the sprocket causes the drive member to slide over the sprocket's teeth if the slider 15 is moved from its advanced position to its home position, so that the drive member does not rotate the sprocket in the clockwise direction in FIG. 2A. Hence, the drive member 19 rotates the sprocket 14 in only one direction (the counterclockwise direction in the view of FIG. 2A). The drive member 19 can be implemented with other devices, such as a pawl that is pivotally mounted to the slider 15, and is spring-loaded against the sprocket, for example.

To permit the slider 15 to be driven to reciprocate, the slider preferably defines a notch 20 on the underside thereof which can be engaged by the apparatus' base unit, as will be described in detail later in this document. To further ensure that the drive member 19 will rotate the sprocket 14 in only one direction, the feeder 10 can also include a one-way member 21. The one-way member 21 can be configured similarly to the drive member 19, and is preferred to be a curved resilient metal leaf spring that has one end fixedly mounted to the body 11, and a second opposite end which extends approximately tangentially toward and curves in an opposite sense relative to the circumferential edge of the sprocket 14. The one-way member 21 makes contact with the circumferential edge of the sprocket 14, and its positioning with respect to the sprocket 14 is such that the one-way member flexes to permit the sprocket's teeth to pass in contact therewith if the sprocket 14 is rotated in the counterclockwise direction in FIG. 2A. On the other hand, the one-way member 21 blocks the sprocket's teeth from moving in the clockwise direction in FIG. 2A.

The feeder 10 also includes a removal member 22 that is fixed to and extends from the upper side edge of the body 11 transversely to the direction in which the tape 1 advances through the guide 12. Preferably, the removal member 22 extends in a direction that is approximately forty-five degrees to the direction in which the tape 1 advances through the feeder 10. The removal member 22 can be positioned adjacent to, but spaced apart from, an opposing, parallel edge of the cover 13 so that the removal member and cover define opposite sides of a slit through which the cover tape 3 extends. As the tape 1 is driven to advance through the feeder 10, the removal member 22 removes the cover tape 3 from the carrier tape 2, as shown in FIGS. 2B and 2C. The removal member 22 is preferably elongated and has a smooth, rounded surface over which the cover tape 3 slides as it is removed from the carrier tape 2. Alternatively, the removal member 22 can be implemented as a roller with a cylindrical portion supported for rotation by an axle fixed to the body 11, for example, so that the cylindrical surface rotates in contact with the cover tape 3 on the axle as the cover tape 3 moves over the removal member 22. The feeder 10 can also include a wheel 23 which is rotatably mounted in the body 11. Preferably, the wheel 23 is mounted coaxially to the sprocket 14 so that the wheel 23 turns with the sprocket. To mount the sprocket and wheel so that they can be rotated together, the feeder 10 can include an axle 24 which extends through a bore defined in the body 11. The axle 24 extends along a common axis of rotation between the sprocket and wheel to fix them together. The wheel 23 defines a groove 25, preferably V-shaped or tapered (perhaps best seen in FIG. 2H), about the peripheral edge thereof. The wheel 23 receives the cover tape 3 from the removal member 22 via a channel 26 defined in the body 11, which channel restricts the movement of the cover tape 3 to advance in a relatively direct path from the removal member 22 to the wheel 23. The cover tape 3 passes through the channel 26 and is positioned around the peripheral edge of the wheel 22. The tapering of the peripheral groove 25 of the wheel 22 compacts the cover tape widthwise so that the cover tape assumes a string-like configuration. To urge the cover tape 3 to advance with the wheel 22 and to force the cover tape 3 into the relatively narrow bottom portion of the wheel's groove 25, the wheel preferably defines pairs of opposing, angled teeth about its peripheral edge on opposite sides of the groove, as perhaps best seen in FIGS. 2G and 2H. From the wheel 23, the compacted cover tape 3 moves with the carrier tape 2 between the underside thereof and the guide 12 so that the compacted cover tape 3 is restricted in its movement. The compacted cover tape 3 and the used carrier tape 2 can be advanced together from the feeder 10 and disposed of without tangling or interfering with the surface mount machinery.

Figures 2G, 2H:
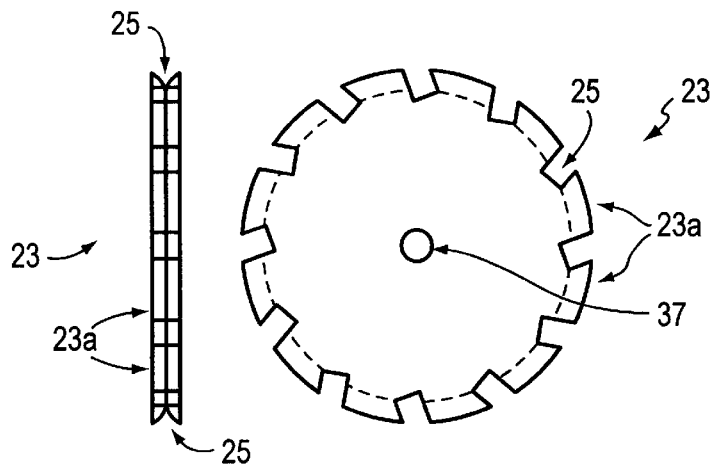
FIGS. 2G–2H are side elevational and top plan views, respectively, of a wheel of the first embodiment of the invented apparatus.
Figures 2D, 2F:
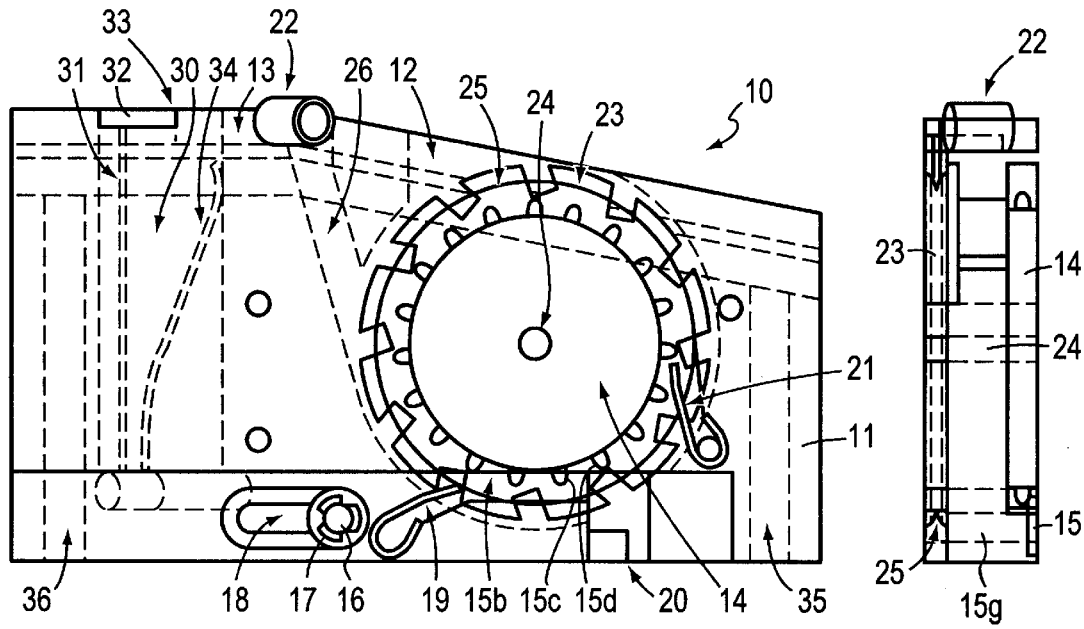
FIGS. 2D–2F are side elevational, top plan and end elevational views, respectively, of the first embodiment of the feeder.

The slider 15 defines a portion 15a that extends transversely relative to the direction of reciprocation of the slider 15, into an opening 30 defined in the body 11, as shown in FIGS. 2C and 2D. The opening 30 extends in a direction parallel to the direction of reciprocation of the slider 15 to permit the portion 15a to move laterally therein. The feeder 10 can include a rod 31, preferably formed of rigid, durable metal, that has one end fixed to the portion 15a. The feeder 10 also includes a cover plate 32 to which the opposite end of the rod 31 is mounted. If the slider 15 is positioned in its home position, the rod 31 supports the cover plate 32 in a position over the tape 1 and spaced apart from the cover 13 to define a pick-up window 33 from which the pick-up device extracts electronic components 5 from the tape 1. As the slider 15 is reciprocated from its home position to its advanced position (i.e., from left to right in FIG. 2A), the portion 15a and rod 31 cause the cover plate 32 to move adjacent to the cover 13 to close the pick-up window 33 immediately before the slider 15 engages the drive member 16 with the sprocket 14. By positioning the cover plate 32 over the pick-up window before the slider 15 forces the drive member 19 to rotate the sprocket 14 to advance the tape 1, the electronic component 5 advancing with the tape into the pick-up window area is prevented from jumping out of the tape 1 by motion or vibration caused by the movement of the slider 15, the drive member 16, the sprocket 14, and the advancing tape 1. Similarly, immediately after the drive member 16 clears the sprocket 14 as the slider moves from its advanced position to its home position, the portion 15a moves the rod 31 and hence the cover plate 32 in a position that is spaced apart from the cover 13 so that the pick-up window 33 is opened to permit the pick-up device to extract the exposed electronic component 5 from the tape 1.

The feeder 10 can include a resilient member 34 which has one end mounted to the portion 15a, and an opposite end which extends across and abuts a side of the opening 30 defined in the body 11. The resilient member 34 can be made of a flexible material such as metal, and spring-biases the slider 15 toward its home position (i.e., toward the left in FIG. 2A or right in FIG. 2C). The resilient member 34 ensures that the slider 15 will be located at its home position unless driven to its advanced position by the base unit.

As shown in FIG. 2D, the body 11 preferably defines spaced bores 35, 36 for mounting the body 11 to the apparatus's base unit, as will be described in detail in a subsequent section of this document. The bores 35, 36 are at least approximately parallel and extend along the vertical direction in FIG. 2D and are open to the bottom side of the feeder 10.

As shown in FIG. 2D, the slider 15 can define a recess 15b on a top surface thereof. The recess 15b provides clearance for the sprocket's teeth to turn if the slider 15 is moved from its home position to its advanced position. On the other hand, as shown in FIG. 2D, if the slider 15 is positioned in its home position, the recess 15b defines a vertical step face 15c in the slider 15 which prevents the sprocket tooth 14a from moving in the counterclockwise direction in FIG. 2D. In addition, if the slider 15 is positioned in its home position, the upper surface 15d of the slider 15 blocks the sprocket tooth 14b so that the sprocket cannot rotate in the clockwise direction in FIG. 2D. Therefore, it should be appreciated that the positioning of the step face 15c and the upper surface 15d of the slider 1S with respect to adjacent teeth 14a, 14b of the sprocket 15 is such that the sprocket can only be positioned at discrete, regularly spaced angular intervals if the slider 15 is located in its home position as shown in FIG. 2D. These features of the feeder 10 help to ensure that electronic components 5 successively fed from the tape 1 to the pick-up device are positioned with relative exactitude in the pick-up window 33 for extraction by the pick-up device.

Figure 2E:
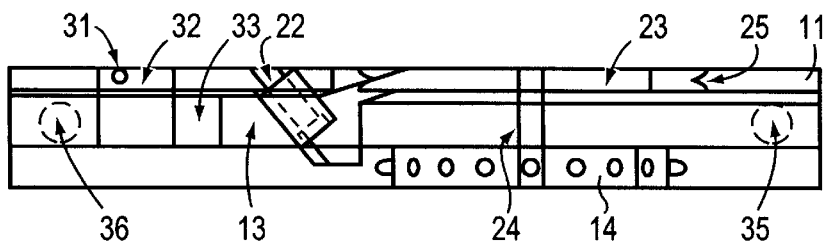

FIGS. 2E and 2F provide different views of the elements of the feeder 10 for greater appreciation of their three-dimensional configuration.

FIGS. 2G and 2H show relatively specific features of the preferred configuration for the wheel 23. The wheel 23 has teeth 23a which are approximately trapezoidal in shape, and are arranged in opposing pairs on opposite sides of the tapered groove 25 whose bottom surface is indicated by broken line in FIG. 2G to indicate that such surface would not be visible to the eye in FIG. 2G. The opposing pairs of teeth 23a are angled forward with respect to the angular direction of rotation of the wheel 23 so that they tend to urge the cover tape 3 to advance longitudinally as it moves with the peripheral or circumferential surface of the wheel 23. The angling of the wheel's teeth 23a also forces the cover tape 3 toward the relatively narrow bottom portion of the groove 25, an action which causes the cover tape 3 to compact widthwise. As shown in FIG. 2G, the wheel 23 can define an aperture 37 located at the rotational axis of the wheel, which is sized to receive the axle 24. One end of the axle 24 can be extended into the aperture 37 and fixed thereto while the opposite end is either integrally formed with or mounted the sprocket 14.

2. Apparatus with Base Unit and First Embodiment of Feeder

Figure 3A:
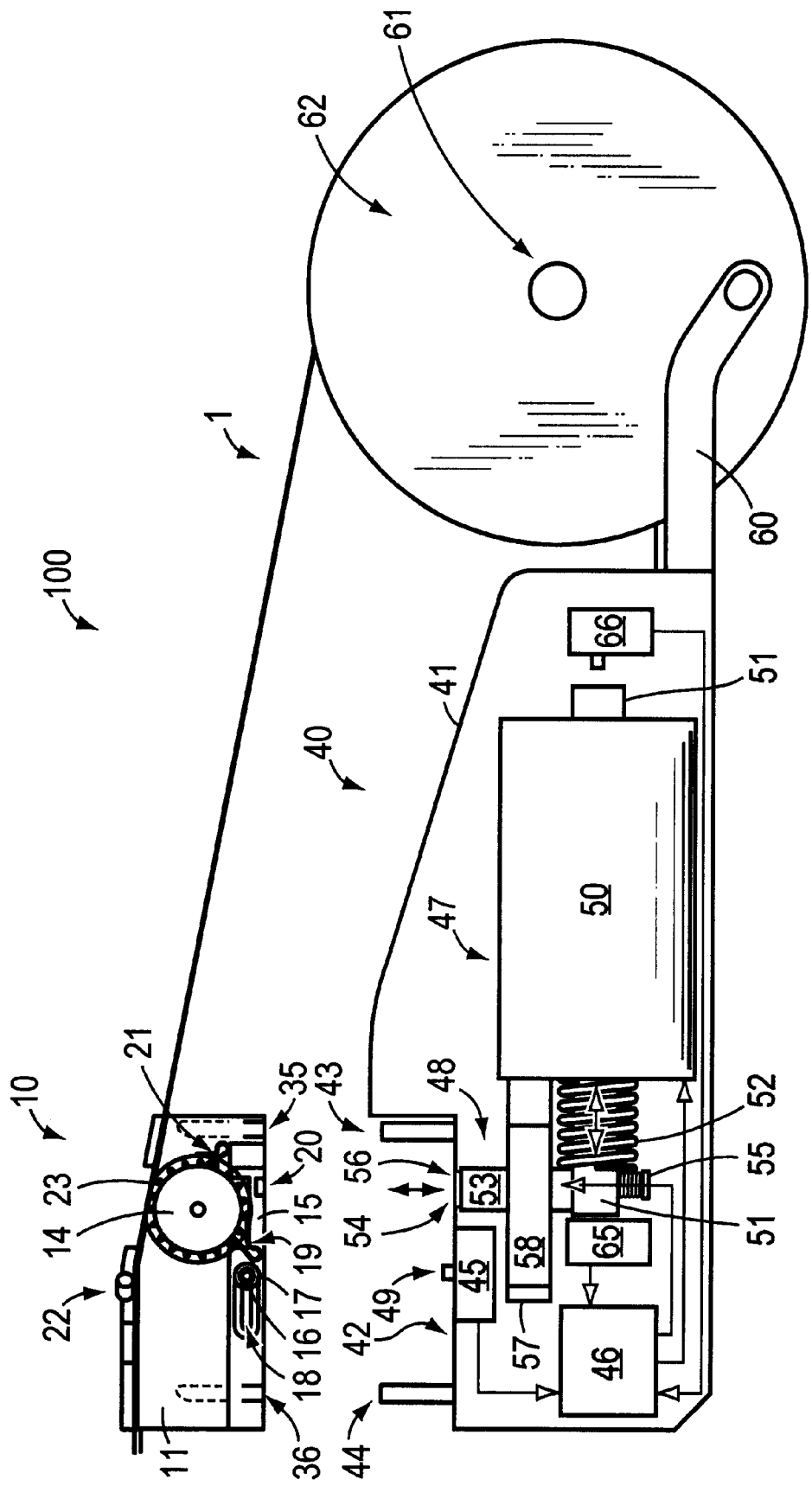
FIGS. 3A is a partially exploded side elevational view of the invented apparatus.

FIG. 3A is a view of the apparatus 100 which basically includes the feeder 10 and the base unit 40. The base unit 40 preferably includes a housing 41 composed of rigid plastic or metal, for example, that is at least partially hollow. The housing 41 defines a surface 42 over which the feeder 10 is positioned on the base unit 40. More specifically, the base unit 40 has elongated posts 43, 44 which extend vertically from the surface 42 of the base unit 40. The posts 43, 44 are received in respective bores 35, 36, respectively, of the feeder 10 if the feeder is properly positioned on the base unit 40. The feeder 10 is held in position on the base unit 40 by the posts 43, 44, but is free to slide thereon.

The base unit 40 further includes spaced, opposing arms 60 mounted to the housing 41. The arms 60 can be used to rotatably support an axle or spindle 61 of a reel 62 upon which a tape 1 is wound. The tape 1 can be unwound from the reel 62 and fed through the guide 12 of the feeder 10. The tape 1 is positioned in the guide 12 so that teeth of the sprocket 14 extend through perforations 6 in the tape. The cover tape 3 is peeled off from the carrier tape 2, fed through channel 26, inserted into the tapered groove 25 of the wheel 23, and passed between the bottom surface of guide 12 and the underside of the carrier tape 2.

Figure 3B:
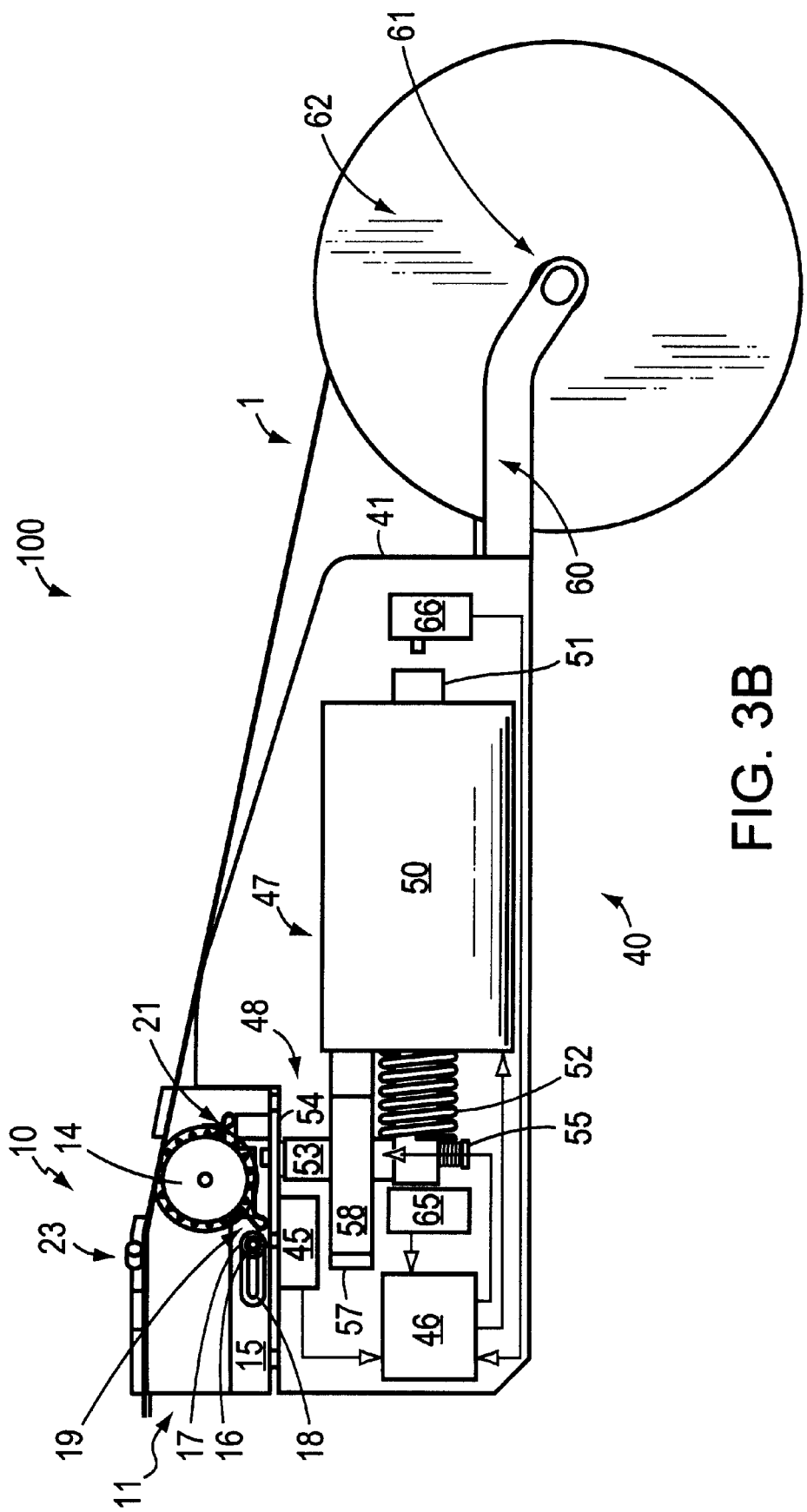
FIGS. 3B–3D are side elevational views of the invented apparatus showing a sequence of actions performed by the base unit to advance a tape after a pick-up device extracts an electronic component from the tape.

The tape advancement mechanism of the base unit 40 generally includes a sensor 45, a controller 46, and first and second solenoid units 47, 48. The sensor 45 can be a pressure switch that is simply an electrical contact switch with a button (such pressure switches are commercially available from many electronic parts suppliers). The pressure switch is mounted substantially flush with the surface 42 of the housing 41, preferably between the posts 43, 44. The pressure switch includes a depressable button 49 which protrudes to an extent above the surface 42. The button 49 rests in contact with the bottom of the feeder 10 if the feeder is positioned on the base unit 40. The sensor 45 is electrically coupled to the controller 46. The controller 46 can be implemented readily with delay and logic gate circuitry, or a pre-programmed processor, microcontroller, programmable logic array (PLA), programmed array logic (PAL), or other devices as will readily occur to those of ordinary skill in this technology. The controller 46 is electrically coupled to the first and second solenoid units 47, 48 to permit selective activation of the respective coils thereof. More specifically, the solenoid unit 47 is preferably mounted to the bottom surface of the housing 41 so that it is fixed thereto. The first solenoid unit 47 includes a coil 50, an armature 51 and a spring 52, and the second solenoid unit 48 includes a coil 53, an armature 54, and a spring 55. The controller 46 is electrically coupled to the coils 50, 53. The controller 46 generates control signals supplied to the coils 50, 53 to cause them to move respective armatures 51, 54 between extended and retracted positions. The armature 51 is movable along the horizontal direction in FIG. 3A, and the coil 53 of the second solenoid unit 48 is mounted transversely to the armature 51 so that the armature 54 is positioned in a slot 56 defined in surface 42 which permits clearance for the horizontal movement in FIG. 3A of the second solenoid unit's armature if extended. The armature 54 is also positioned immediately under the notch 20 of the slider 15 if the feeder 10 is positioned on the base unit 40, as shown in FIG. 3B. The base unit 40 can also include a guide bar 57 which defines a slot 58 through which the coil 53 of the solenoid unit 48 extends. The guide bar 57 substantially restricts the movement of the solenoid unit 48 to the horizontal direction in FIG. 3A for enhanced stability during movement of the solenoid unit 48. The base unit 40 can also include limit switches 65, 66 positioned in proximity to respective ends of the armature 51. The limit switch 65 is fixed in position by mounting to the housing 41, for example, and generates a signal indicative of whether the armature 51 is in its extended position. The limit switch 65 is coupled to output its signal to the controller 46. The limit switch 66 is positioned to detect whether the armature 51 is in its retracted position, and generates a signal indicative thereof. The limit switch 66 is electrically coupled to the controller 46, to output its signal thereto.

Figure 3C:
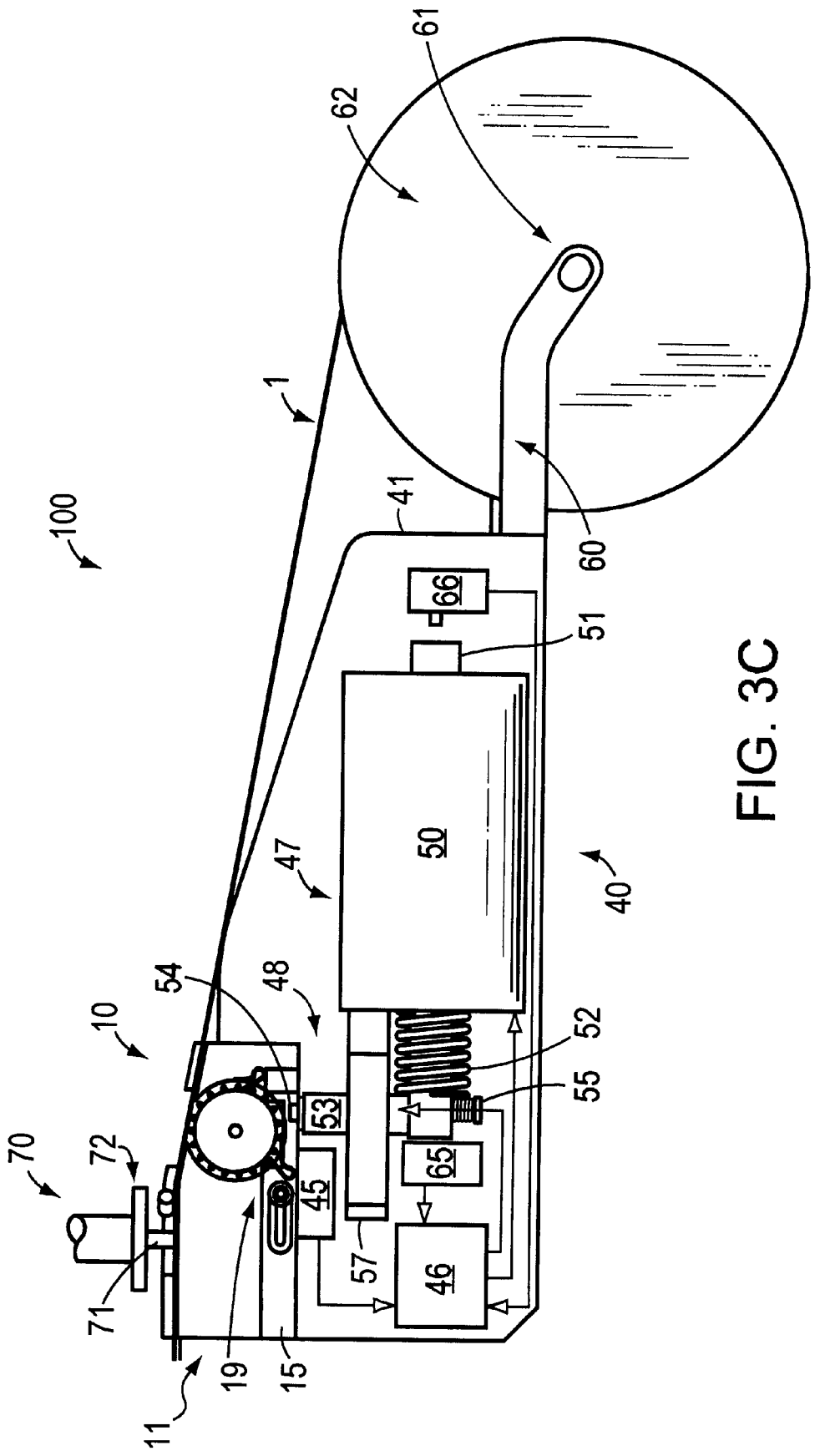
Figure 3D:
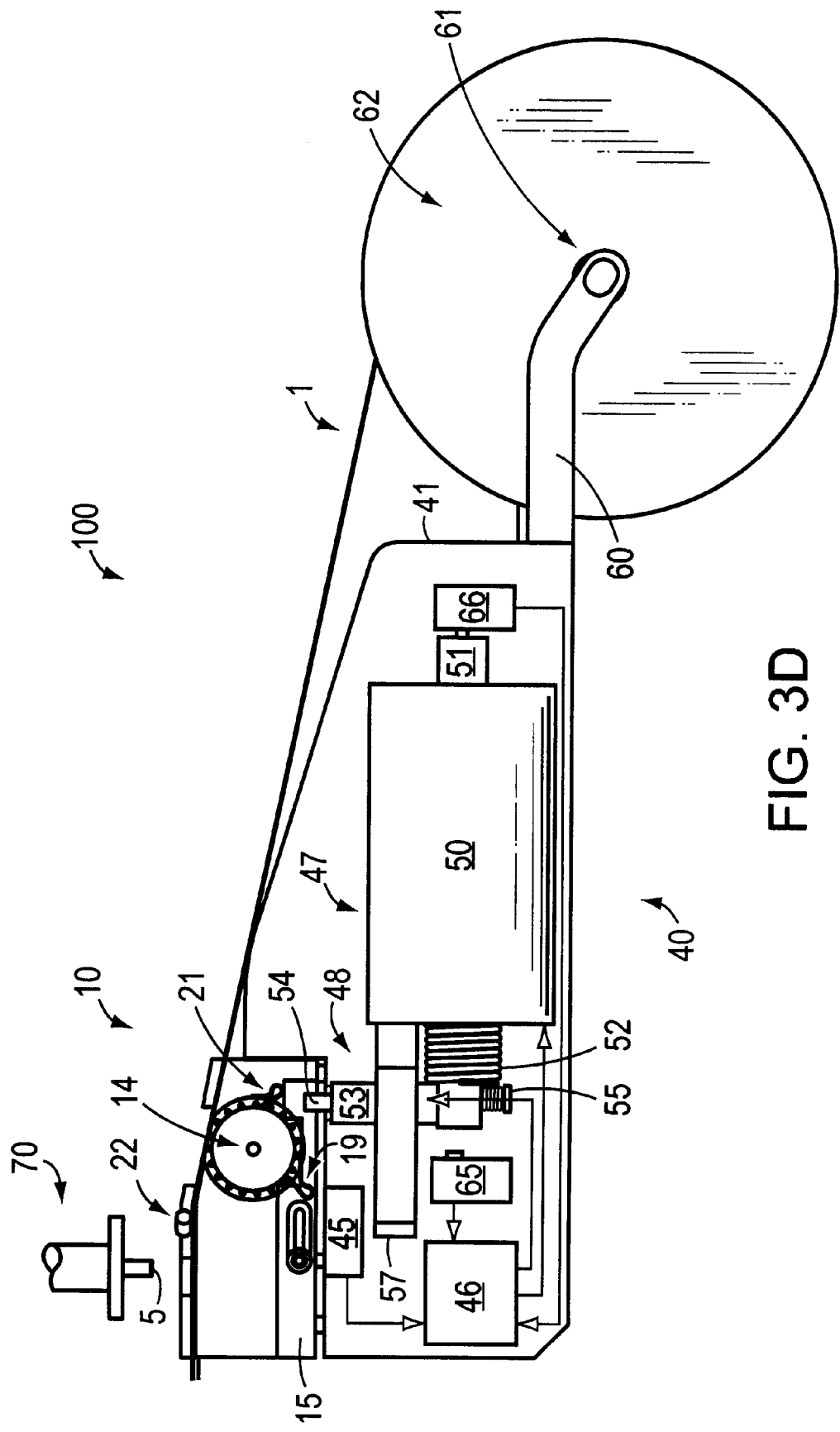

In FIG. 3C, a pick-up device 70 moves into close proximity with the feeder 10 to extract an electronic component 5 to be installed in a circuit board (not shown). The pick-up device 70 can include a suction nozzle 71 which communicates with a vacuum supply (not shown) to lift the electronic component 5 from the carrier tape 2 by suction. The pick-up device can also include a reflector 72 which extends outwardly from the nozzle 71, and is used by machine vision mechanisms associated with the pick-up device 70, which are not part of this invention. Immediately prior to the pick-up device moving into close proximity with the feeder 10, the solenoid units 47, 48 are in their home positions in which the armature 51 is in an extended position and the armature 54 is in a retracted position. As the pick-up device 70 moves into close proximity with the feeder 10 to extract the electronic component, the tip of the nozzle 71 presses against the tape 1, also exerting pressure against the feeder 10 so that it slides downwardly on the posts 43, 44. This movement of the feeder 10 causes the feeder's bottom surface to press against and depress the button 49 of sensor 45. In response to depression of its button 49, the sensor 45 activates its signal to indicate that the pick-up device 70 is in close proximity to the feeder 10, and this signal is received by the controller 46. In response to activation of the sensor's signal, the controller 46 generates a signal to the coil 53, causing such coil to extend the armature 54 into the notch 20 defined in the slider 15. After securing the electronic component 5 on the nozzle 71, the pick-up device 70 moves away from the feeder 10 to move toward a circuit board into which the component is to be installed. As pressure against the button 49 is released as the pick-up device 70 moves away from the feeder 10, the sensor 45 deactivates its signal. In response to the deactivation of the signal by the sensor 45, after a predetermined time delay sufficient to permit the pick-up device 70 to move clear of the feeder 10, the controller 46 generates a control signal supplied to the solenoid unit 47, or more specifically, the coil 50, to cause the solenoid unit 47 to retract its armature 51, thus causing the extended armature 54 to force the slider 15 from its home position to its advanced position, as shown in FIG. 3D. As the slider 15 moves from its home position to its advanced position, the drive member 19 engages with a tooth of the sprocket 14, forcing the sprocket to rotate in the counterclockwise direction in FIG. 3D by an angular amount equivalent to the interval between electronic components 5 on the tape 1. As a result, the sprocket's teeth advance the tape 1 from the reel 62 by one interval. Accordingly, the next electronic component 5 is advanced into a position for extraction by the pick-up device 70. Because the sprocket 14 is coaxially fixed to the wheel 23, the rotation of the sprocket 14 also causes the wheel 23 to rotate, pulling upon and removing an interval length of the cover tape 3 from the carrier tape 2 to expose an electronic component 5 for extraction by the pick-up device 70. The wheel 23 also advances and compacts an interval of the cover tape 3 and feeds a compacted interval of the cover tape 3 between the bottom surface of the guide 12 and the underside of the carrier tape 2 for disposal by a cutting machine, for example, that is not part of the invented apparatus. As the armature 51 reaches its retracted position, the limit switch 66 activates its signal which is supplied to the controller 46. In response to activation of the signal from the limit switch 66, the controller 46 deactivates its control signal to the coil 50 to de-energize such coil, thus permitting the bias of spring 52 to move the armature 51, and hence also the slider 15 via armature 54 engaged therewith, to return to its extended, home position. The arrival of the armature 51 at its extended position is detected by the limit switch 65, which causes the limit switch 65 to activate its signal which is supplied to the controller 46. In response to activation of the signal of limit switch 66, the controller 46 deactivates its control signal to de-energize the coil 53 to permit the bias of spring 55 to return the armature 54 to its retracted position in which the armature 54 is disengaged from the slider 15. The base unit 40 and feeder 10 are thus returned to their home positions, as shown in FIG. 3B. The above-described sequence of control signals can be repeated by the controller 46 each time the pick-up device 70 removes electronic components 5 from the tape 1 and trips the sensor 45 to activate its signal. It should be appreciated that the invented apparatus 100 is entirely self-advancing, and thus requires no control or synchronization with other surface mount machinery. This feature of the apparatus 100 provides significant simplification over previous surface mount machinery which requires extensive control coordination between feeder and pick-up devices for proper operation. Of course, it is also possible for the base unit 40 to output its control signals and the signals generated by sensor 45 and limit switches 65, 66 to an external processor for control of surface mount machinery such as the pick-up device 70, and also for fault diagnosis to detect whether the feeder 10 and/or base unit 40 is operating correctly, and if not, to determine the source of the problem.

Although the cover plate 32 and the rod 31 are not shown in FIGS. 3A–3D to simplify these drawings, they can of course be included in the feeder 10 to prevent the escape of electronic components 5 uncovered by removal of cover tape 3 during advancement of the tape 1 by the base unit 40 before such components are extracted by the pick-up device 70. Because the cover plate 32 and rod 31 are coupled to the slider 15, the cover plate and rod 31 move with the slider 15 as it is driven by the base unit 40. The resilient member 34 can also be used in the feeder 10, and its biasing of the slider 15 toward its home position assures that the notch 20 is immediately above the armature 54 of the solenoid unit 48 so that such armature can readily engage with the slider 15 upon placing the feeder 10 on the base unit 40.

It should also be appreciated that the limit switches 65, 66 can be omitted from the apparatus 100, in which case the controller 46 can be preprogrammed or preconfigured to detect the deactivation of the sensor's signal, to wait for a predetermined period of time to permit the pick-up device 70 to move clear away from the feeder 10, and thereafter, to generate the control signals to the solenoid units 47, 48 with predetermined timings sufficient to ensure that the solenoid units 47, 48 engage with and move the slider 15 from its home to its advanced position and back again, and then disengage from the slider 15. Moreover, if the base unit 40 is adapted for only one feeder 10, the second solenoid unit 48 can be replaced with a rigid rod or other member fixed to the armature 51 of the solenoid unit 47, which extends into the notch 20 of the slider 15. In this case, the controller 46 can be preprogrammed or preconfigured to generate a control signal to reciprocate the armature 51 between its extended and retracted positions, based on the deactivation of the sensor's signal, and optionally also based on a signal generated the limit switch 66.

Rather than using the two posts 43, 44, the base unit 40 could include a greater number of posts, or only a single post, preferably with a square, rectangular or other non-circular cross-section, or any other device which holds the feeder 10 to the base unit 40, and yet permits the feeder 10 to move freely against and away from the sensor 45 as pressure is applied and released, respectively, by the pick-up device 70. Also, the feeder 10 is preferred to be mounted to the based unit 40 to permit the feeder 10 to be freely removable therefrom, as is the case with the apparatus 100 described and shown herein. Because the feeder 10 is freely removable from the base unit 40, the feeder can be readily replaced if it malfunctions or wears out, or can be replaced with a feeder that accommodates a different tape size or configuration. In addition, as a result of this invention, reels can now be commercially sold together with feeders 10 that are pre-loaded with respective tapes 1, a feature which greatly facilitates the loading of a tape into surface mount machinery as the reel need only be positioned on its stand and the feeder placed on the base unit 40 to complete the tape loading operation. Moreover, the base unit 40 can be adapted or sized to fit in virtually any surface mount machine on the market. Once installed on the surface mount machine, virtually any tape size and configuration can be accommodated by the base unit 40 because the feeders 10 can be universally configured to fit on any base unit 40.

3. Second Embodiment of Feeder

Figure 4A:
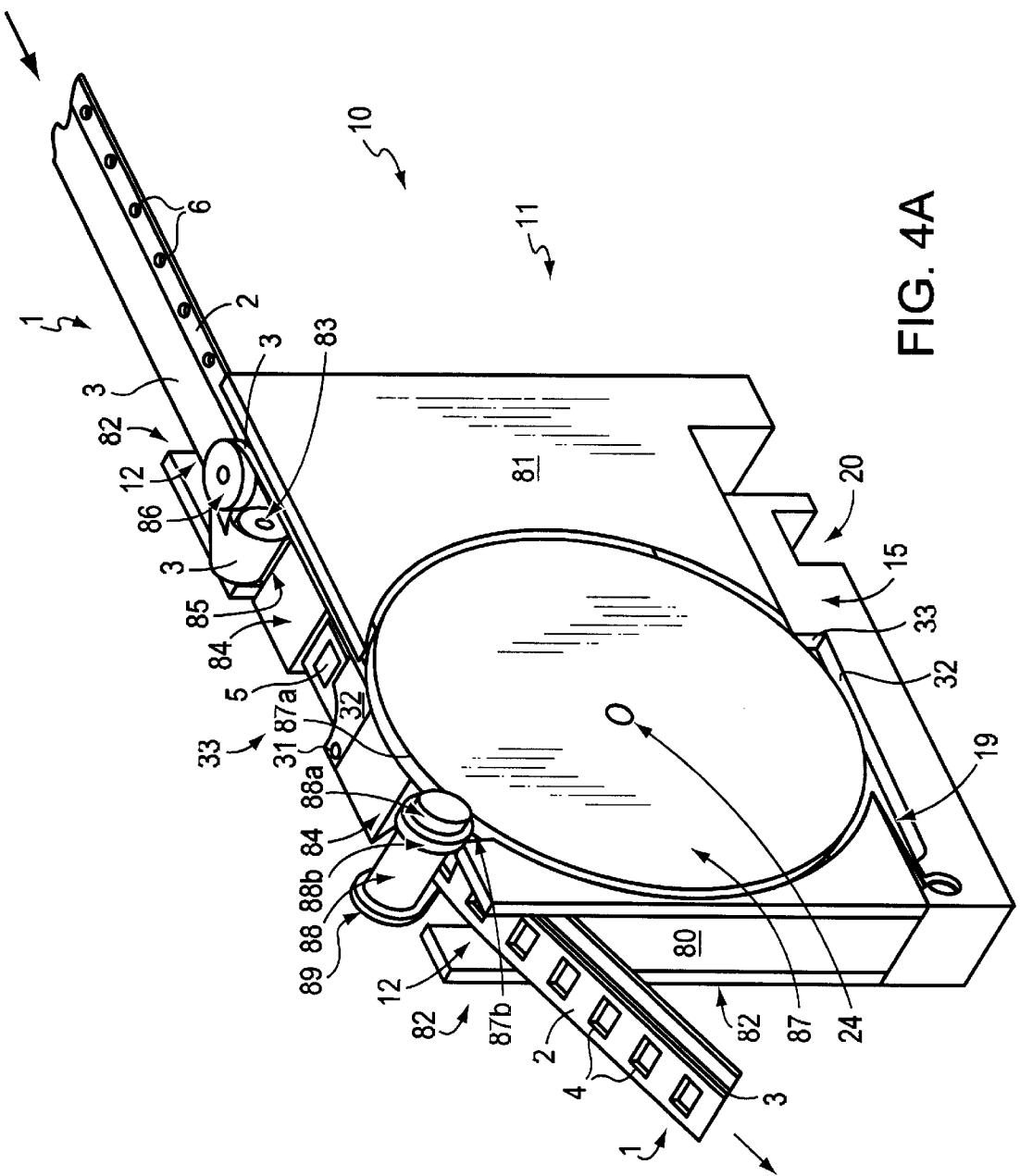
FIGS. 4A–4D are perspective, top plan, bottom plan and side elevational views, respectively, of a second embodiment of a feeder of the invented apparatus.
Figure 4B:
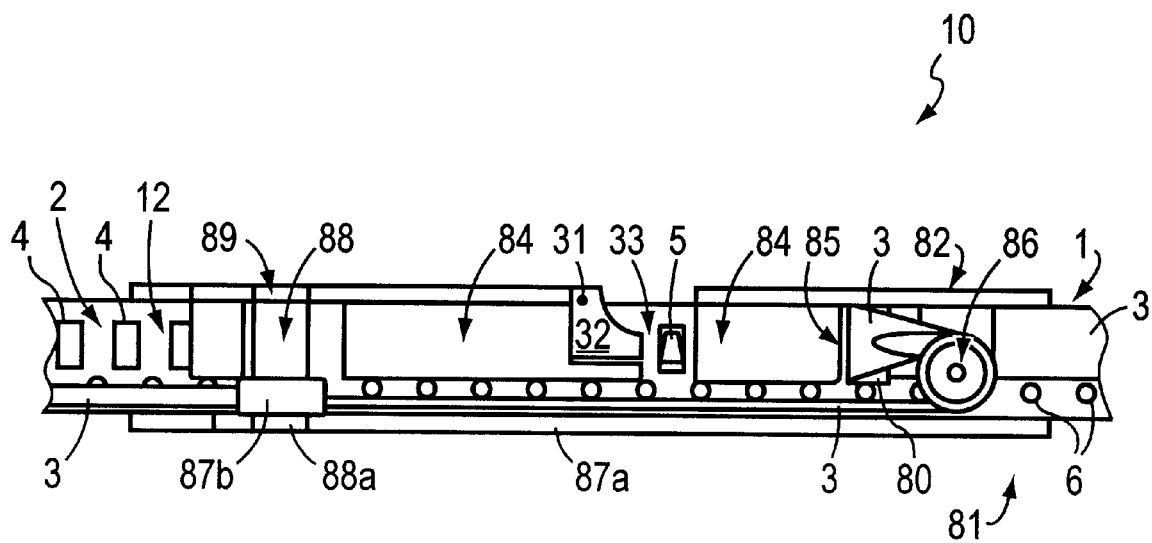
Figure 4C:
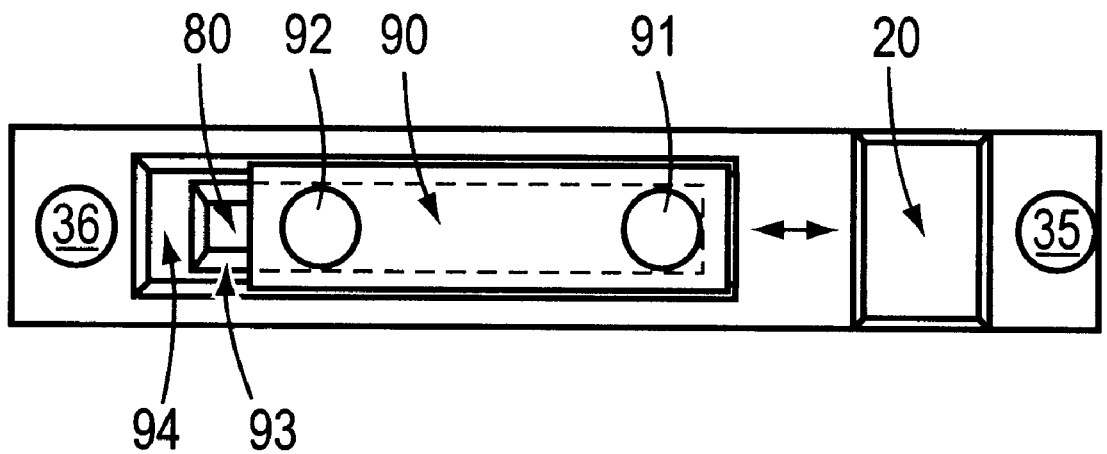
Figure 4D:
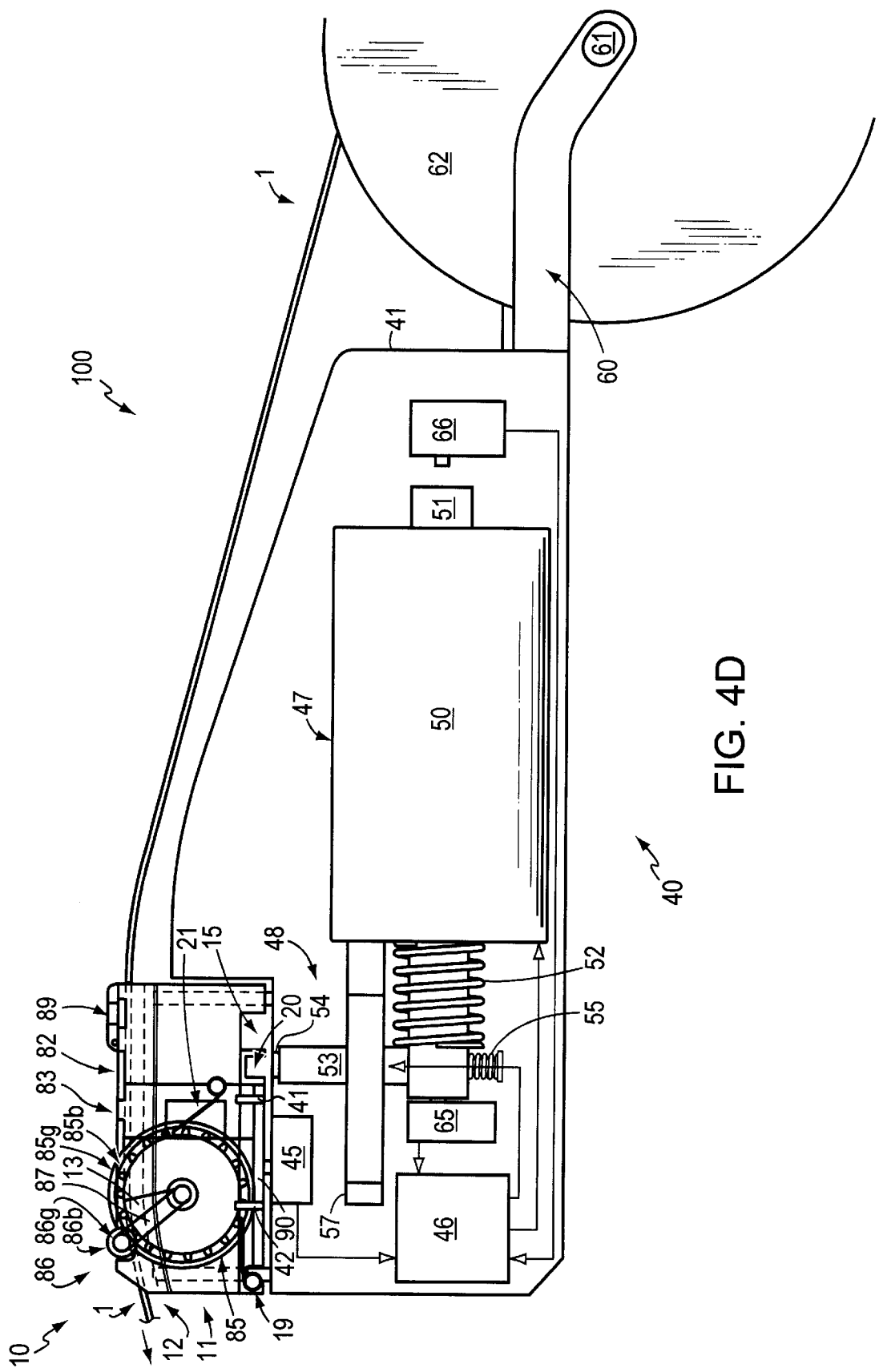

FIGS. 4A–4C are views of a second embodiment of the feeder 10 which is similar in several respects to the feeder of FIGS. 2A–3D. The tape 1 is advanced by the feeder 10 through the guide 12 defined on the top surface of the feeder 10 as shown in FIG. 4A. In this embodiment, the body 11 includes a block portion 80, and side plates 81, 82 attached on opposite side surfaces of the block portion 80. The side plates 81, 82 extend upwardly to a degree from the block portion 80 to define the side surfaces of the guide 12. The top surface of block portion 80 defines the bottom surface of the guide 12. The feeder 10 includes a removal member 83 mounted to the side plate 82. The removal member 83 preferably extends in a direction substantially perpendicular to the direction in which the tape advances through the guide 12, and is positioned adjacent to a portion of the feeder's cover 84 to define a slit 85. The cover 84 extends perpendicularly from the side plate 82 over the guide 12, and is preferably formed integrally with the side plate 82. The cover tape 3 from the tape 1 passes through the slit 85 and folds over removal member 83. The removal member 83 can define a smooth or rounded surface over which the cover tape 3 folds, or can have the configuration of a cylinder which rotates about an axle or shaft fixed to the side of the guide 12. The feeder 10 also includes a turning member 86. The cover tape 3 advances from the removal member 83 to the turning member 86 which defines a tapered groove about its circumferential or peripheral surface, that receives and compacts the cover tape 3 into a string-like configuration. The turning member 86 can be either fixed in position to the cover 84 or can be rotatably mounted to a shaft or axle fixed to the cover 84. The feeder 10 also includes a wheel 87, a roller 88, and a lever arm 89. From the turning member 86, the compacted cover tape 3 advances with the carrier tape 2 between edges of the cover 84 and the side plate 81, and further advances between the wheel 87 and the roller 88. The roller 88 is rotatably mounted to and extends substantially perpendicularly from one end of the lever arm 89 whose opposite end is rotatably mounted to the axle 24 to which the wheel 87 and the sprocket 14 (not visible in the view of FIG. 4A) are fixed. The arm 89 can thus rotate to a limited extent about the axle 24. The wheel 87 defines two circumferential edges 87a, 87b. The radius of the edge 87a is larger than the radius of the edge 87b. Similarly, the roller 88 defines adjacent circumferential surfaces 88a, 88b, but in this case the surface 88a has a smaller radius than the circumferential surface 88b. The surfaces 87a, 88a contact one another so that as the wheel 88 turns with the sprocket 14 as it is driven by the base unit 40, the roller 88 also turns with the wheel 87. Because of the relative sizing of the surfaces 87a, 88a, the roller 88 rotates at a faster angular rate (for example, 20% faster) than the rate at which the tape 1 advances through the guide 12. The surfaces 87b, 88b compress the tape 1 from its upper and lower sides, respectively, and the surface 88b contacts the cover tape 3 on the top side of the tape 1. Because the surface 88b turns at a faster rate than the surface 87b, the surface 88b stretches the cover tape 3 so that it is further compacted for disposal. In addition, as the wheel 87 turns with the sprocket 14, the lever arm 89 swings to a degree in the counterclockwise direction in FIG. 4A, an action which causes the surface 88b to compress the cover tape 3 onto the top surface of the carrier tape 2. The cover tape 3 is thus fixed to the carrier tape 2 so that it does not hang loosely to interfere with the surface mount machinery. The feeder 10 of FIGS. 4A–4C thus effectively disposes of the cover tape 3 without requiring relatively complicated or costly take-up reels or associated equipment used in previous feeder devices.

FIGS. 4B and 4C are different views of the second embodiment of the feeder 10, which provide a better understanding of the three-dimensional configuration, shape and alignment of the elements previously described. In the embodiment of FIGS. 4A–4D, feeder 10 includes a plate 90 and screws 91, 92 to slidably mount the slider 15 to the body 11. More specifically, as shown in FIG. 4C, the slider 15 defines a relatively narrow opening 93 which communicates with a relatively wide opening 94 formed in the bottom surface of the slider 15. The openings 93 and 94 extend through the slider 15 from its top to bottom surface, and also extends laterally along the direction of reciprocation of the slider 15. The plate 90 is sized to closely fit in the opening 94, but is wider than opening 93. The screws 91, 92 extend through respective bores in the plate 90 and through opening 93, and are fixed into the block portion 80. Because the slider's opening 93 permits lateral passage of the screws 91, 92, the slider 15 is free to reciprocate along the horizontal direction in FIG. 4C, but is also secured to the block portion 80 of the feeder 10 by the presence of plate 90 and screws 91, 92. As is apparent from FIG. 4D, the second embodiment of the feeder 10 can be driven with a base unit 40 that is substantially similar in configuration and operation to the base unit previously shown and described in FIGS. 3A–3D.

4. Apparatus with Base Unit Adapted to Drive a Plurality of Feeders

Figure 5:
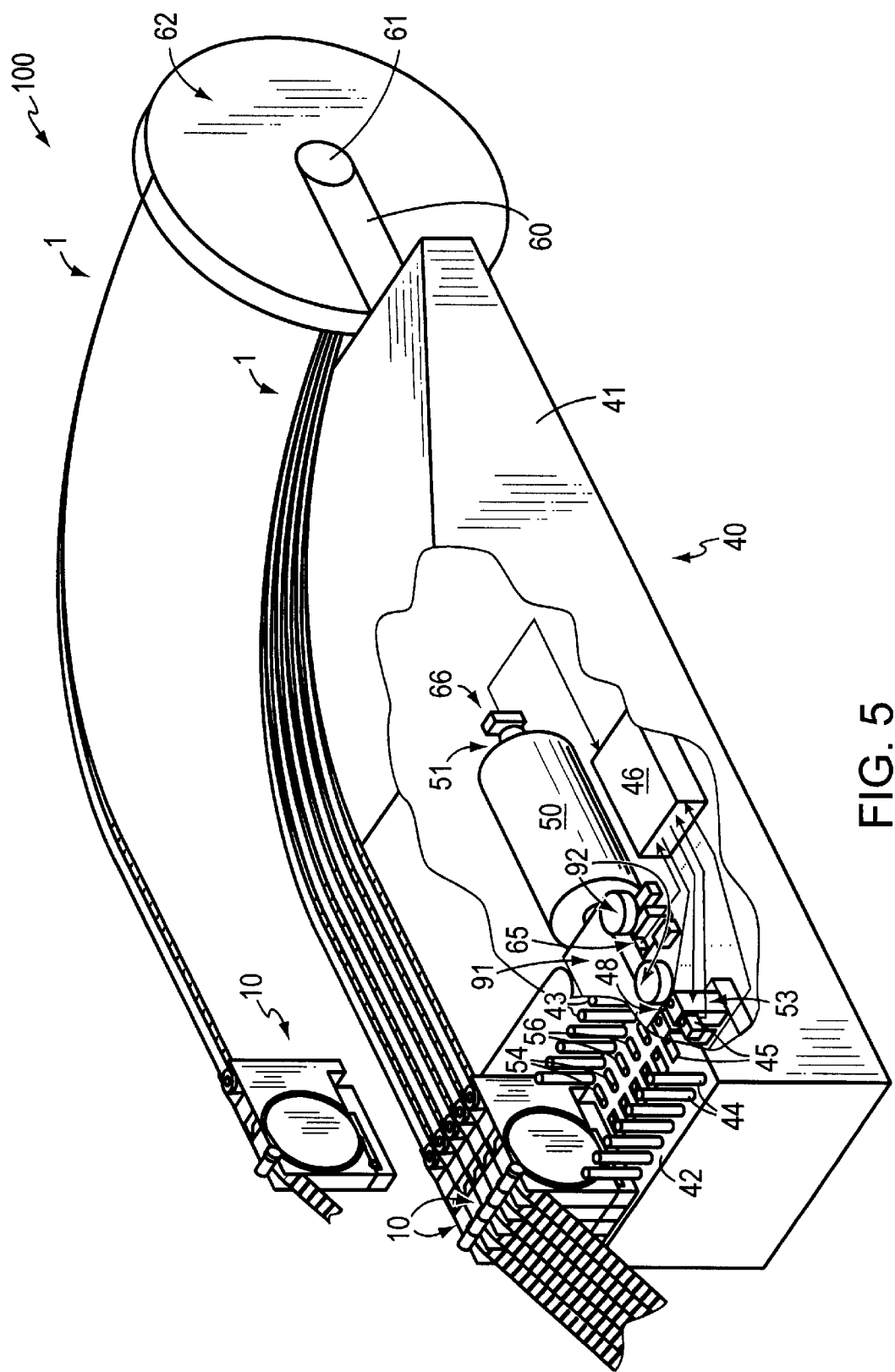
FIG. 5 is a perspective view of the invented apparatus adapted to feed a plurality of tapes containing electronic components.

FIG. 5 is a view of the invented apparatus 100 which is adapted to feed a plurality of tapes 1 containing electronic components 5. Although only one reel 62 is shown in FIG. 5 for simplicity, the tapes for respective feeders can be mounted on respective reels 62 on additional arms 60 similar to those shown in FIG. 5. Essentially, the apparatus 100 of FIG. 5 includes a plurality of feeders 10 which are positioned side-by-side on the base unit 40. The base unit 40 includes posts 43, 44 and sensors 45 mounted on the surface 42 for respective feeders. In addition, solenoid units 48 are positioned beneath respective slots 56 in surface 42, and are mounted at spaced positions on one end of member 91. The opposite end of member 91 is mounted to the armature 51 of the solenoid unit 47. The member 91 is guided by rollers 92 which are supported by axles or shafts (not shown) mounted to the housing 41 so that the solenoid unit 47 can smoothly reciprocate the member 91, and hence also the solenoid units 48 mounted thereto. The controller 46 is electrically coupled to receive sensor signals from the sensors 45 for the feeders 10, and is electrically coupled to the coils 50, 53 of respective solenoid units 47, 48. Springs 52, 55 for respective solenoid units 47, 48 are present but not visible in the view of FIG. 5. The controller 46 generates control signals supplied to the solenoid units 47, 48 to advance the tapes 1 of the particular feeder(s) requiring advancement, based on the signals from sensors 45 and the signals from the limit switches 65, 66. The solenoid unit 47 reciprocates all of the solenoid units 48 together by moving its armature 51 and the member 91 mounted thereto, between retracted and extended positions. Thus, the apparatus 100 of FIG. 5 avoids the use of functionally redundant mechanisms common in previous feeder devices by using a single solenoid unit 47 which is used to reciprocate all solenoid units 48. The machinery of the base unit 40 required to advance the tapes in the feeders 10 is thus greatly simplified compared to previous feeder devices.

5. Processing Performed by Controller

Figure 6A:
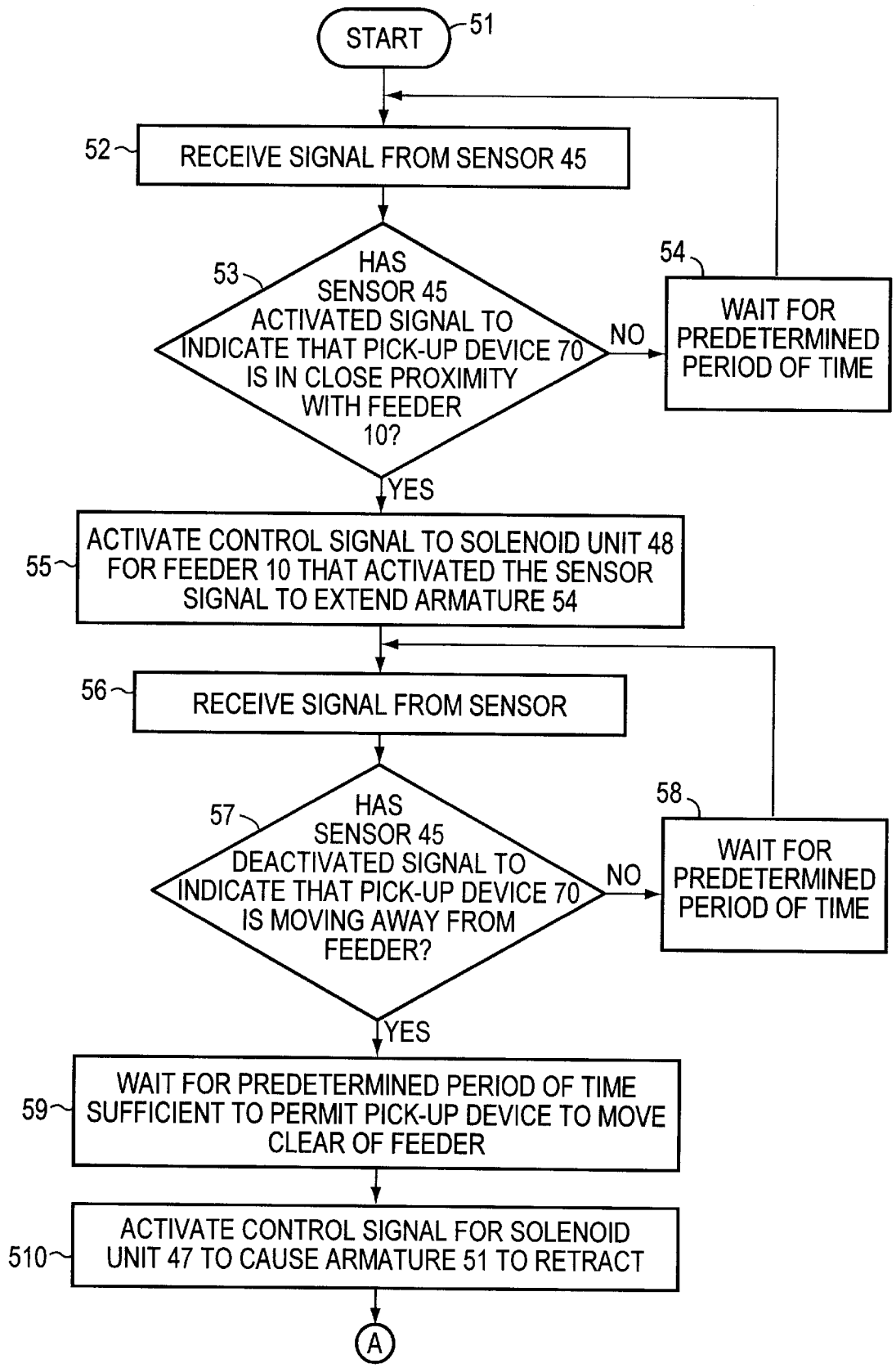
FIGS. 6A and 6B are flow charts of processing performed by the controller of the invented apparatus.
Figure 6B:
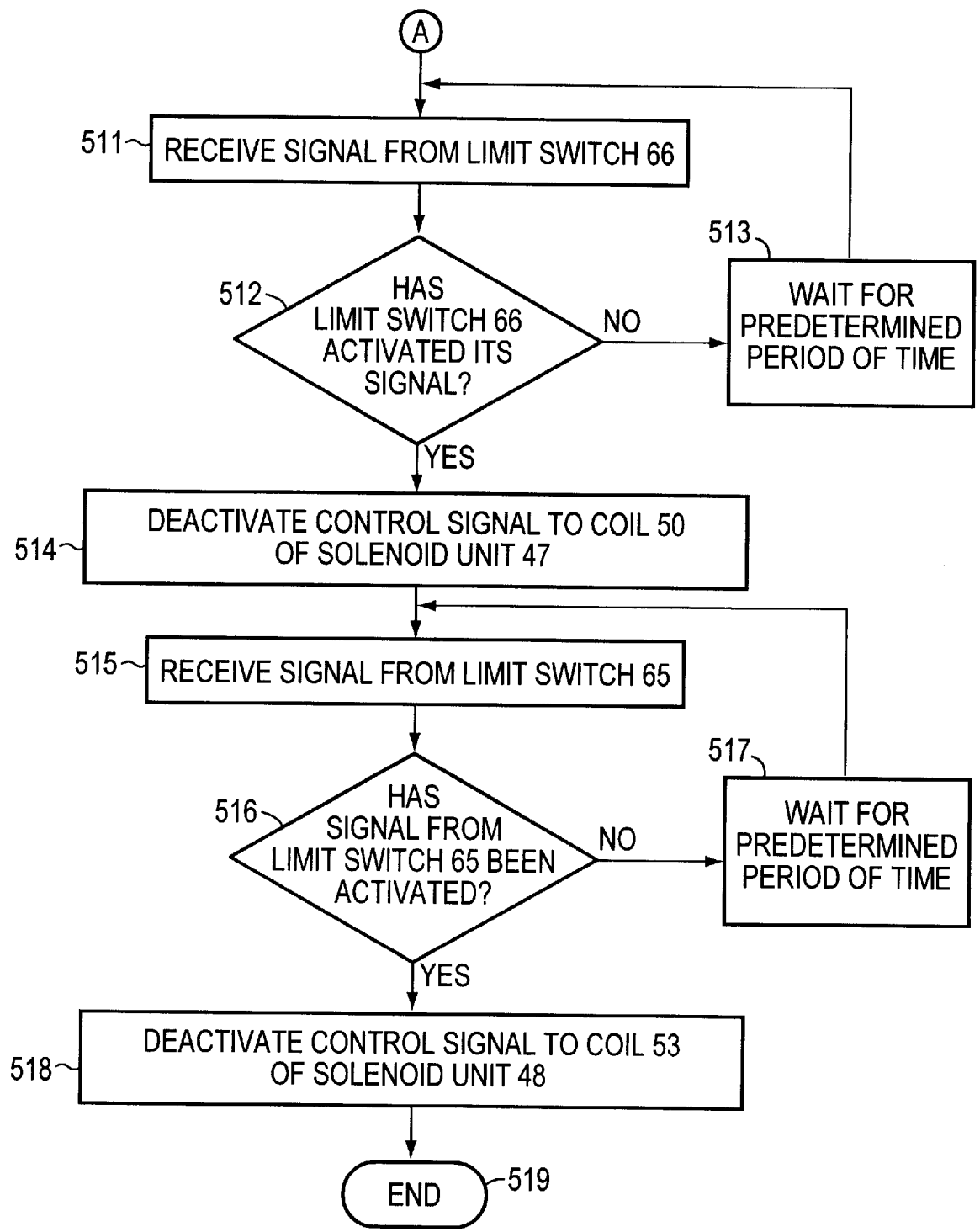

FIGS. 6A and 6B are flowcharts of processing performed by the controller 46 if implemented as a programmable device such as a microcontroller, microprocessor, PLA, PAL or the like. In step S1 of FIG. 6A, processing performed by the controller 46 begins. In step S2, the controller 46 receives a signal generated by the sensor(s) 45. In step S3, the controller 46 determines whether the sensor 45 for a respective feeder has activated its sensor signal to indicate that the pick-up device 70 is in close proximity with and pressing against such feeder. If the determination in step S3 is negative, the controller 46 waits for a predetermined period of time (e.g., 0.1 milliseconds) in step S4, and repeats steps S2 and S3. On the other hand, if the determination in step S3 is affirmative, in step S5, the controller 46 activates and outputs a control signal to the coil 53 of the solenoid unit 48 to cause the armature 54 to extend into the notch 20 defined in the slider 15 of the feeder 10. In step S6, the controller 46 receives the signal from sensor 45, and in step S7 determines whether the signal from the sensor 45 has been deactivated to indicate that the pick-up device 70 has moved away from the feeder 10. If the determination in step S7 is negative, the controller 46 waits for a predetermined period of time (e.g., 0.1 milliseconds) in step S8, and repeats steps S6 and S7. On the other hand, if the determination in step S7 is affirmative, in step S9 the controller 46 waits for a predetermined period of time sufficient to permit the pick-up device 70 to clear away from the feeder 10 before advancing the feeder's tape. In step S10, the controller 46 activates and outputs a control signal to the coil 50 of the solenoid unit 47 to cause the armature 51 to retract. In step S11 of FIG. 6B, the controller 46 receives the signal from the limit switch 66, and in step S12 determines whether the limit switch 66 has activated its signal to indicate that the armature 54 is in its retracted position. If the determination in step S12 is negative, in step S13, the controller 46 waits for a predetermined period of time (e.g., 0.1 milliseconds), and repeats steps S11 and S12. On the other hand, if the determination in step S12 is affirmative, in step S14 the controller deactivates the control signal to the coil 50 of the solenoid unit 47 to permit armature 51 to return to its extended, home position under the bias of the spring 52. In step S15, the controller 46 receives the signal from the limit switch 65, and in step S16, determines whether the signal from the limit switch 65 has been activated. If the determination in step S16 is negative, the controller 46 waits for a predetermined period of time (e.g., 0.1 milliseconds) in step S17 and repeats steps S15 and S16. On the other hand, if the determination in step S16 is affirmative, in step S18, the controller deactivates the control signal to the coil 53 of the solenoid unit 48 to permit the bias of spring 55 to return the armature 54 to its retracted, home position. In step S19, the processing performed by the controller 46 ends.

The controller 46 can perform the above processing repeatedly. In addition, the controller 46 can perform the above processing for a plurality of feeders 10 (as shown in FIG. 5, for example) using respective sensors 45 and solenoid units 48, the solenoid unit 47, and optionally also the limit switches 65, 66.

In the following claims, "means for removing the cover tape" refers to removal member 22 or 33, "means for compacting the cover tape" refers to the wheel 23 or the turning member 83, and "means for compressing the cover tape to the carrier tape" refers to wheel 87 and roller 88, and optionally also lever arm 89.

The many features and advantages of the present invention are apparent from the detailed specification and thus, it is intended by the appended claims to cover all such features and advantages of the described apparatus and methods which follow in the true spirit and scope of the invention. Further, since numerous modifications and changes will readily occur to those of ordinary skill in the art, it is not desired to limit the invention to the exact construction and operation illustrated and described. Accordingly, all suitable modifications and equivalents may be resorted to as falling within the spirit and scope of the invention.

I claim:

1. An apparatus for feeding electronic components positioned at intervals on a tape for extraction by a pick-up device, the apparatus comprising:

a feeder receiving the tape, the feeder defining a plurality of spaced bores, the feeder including:

a body defining a guide to receive the tape, the guide further defining a pick-up window to permit extraction of an electronic component exposed in the pick-up window from the tape;

a sprocket rotatably mounted in the body, the sprocket having a circumferential edge positioned at least approximately tangentially to a surface of the guide, the circumferential edge having teeth extending into perforations defined in the tape;

a slider slidably mounted to reciprocate in the body in a direction at least approximately tangential to the circumferential edge of the sprocket;

a drive member mounted to the slider; and a base unit having a plurality of spaced posts adapted to be received in the bores of the feeder, the base unit including a pressure sensor positioned in close proximity to the feeder if the feeder is positioned on the base unit, the pressure sensor generating a signal that is activated by the pick-up device exerting pressure against the feeder to extract an electronic component, and that generates a signal that is deactivated by release of pressure exerted against the feeder as the pick-up device moves away from the feeder to extract the electronic component from the tape, the base unit driving the slider to reciprocate to cause the drive member to engage with and rotate the sprocket in one direction to advance the tape by an interval to expose the next electronic component in the tape for extraction by the pick-up device, based on the deactivation of the signal from the sensor.

2. An apparatus as claimed in claim 1, wherein the feeder includes:

a body defining a guide to receive the tape;

a sprocket rotatably mounted in the body, the sprocket having a circumferential edge positioned at least approximately tangentially to a surface of the guide, the circumferential edge having teeth extending into perforations defined in the tape;

a slider slidably mounted to reciprocate in the body in a direction at least approximately tangential to the circumferential edge of the sprocket; and a drive member mounted to the slider, the base unit driving the slider to reciprocate to cause the drive member to engage with and rotate the sprocket in one direction to advance the tape.

3. An apparatus as claimed in claim 2, wherein the feeder further includes:

a one-way member having a first end mounted to the body and a second opposite end engaging with the sprocket, to permit the sprocket to be rotated in only one direction.

4. An apparatus as claimed in claim 2, wherein the tape includes a carrier tape defining recesses for holding respective electronic components at intervals along the length of the carrier tape, and a cover tape removably attached to the carrier tape to hold the electronic components in the carrier tape, the apparatus further comprising:

means for removing the cover tape from the carrier tape to expose electronic components for extraction by the pick-up device; and means for compacting the cover tape removed from the carrier tape into a string-like configuration.

5. An apparatus as claimed in claim 4, further comprising:

means for compressing the cover tape to the carrier tape.

6. An apparatus as claimed in claim 2, wherein the tape includes a carrier tape defining recesses for holding respective electronic components at intervals along the length of the carrier tape, and a cover tape removably attached to the carrier tape to hold the electronic components in the carrier tape, the feeder further including:

a removal member mounted to the body and extending in a direction transverse to the direction in which the tape moves through the guide, the cover tape removed from the carrier tape to expose electronic components for extraction by the pick-up device folding over the removal member; and a wheel rotatably mounted to the body and mounted coaxially to the sprocket, the wheel defining a tapered groove about its periphery to receive cover tape from the removal member and to compact the cover tape into a string-like configuration.

7. An apparatus as claimed in claim 6, wherein the compacted cover tape advances from the wheel between an underside of the carrier tape and the guide defined in the body to exit the feeder for disposal.

8. An apparatus as claimed in claim 6, wherein the body defines a channel to guide the cover tape from the removal member to the wheel.

9. An apparatus as claimed in claim 6, wherein the wheel defines opposing pairs of angled teeth about its peripheral edge positioned on opposite sides of the tapered groove, the teeth of the wheel urging the cover tape to advance and urging the cover tape to move into the relatively narrow bottom portion of the tapered groove to compact the cover tape as the wheel rotates with the sprocket if driven by the slider, the drive member, and the base unit.

10. An apparatus as claimed in claim 2, wherein the tape includes a carrier tape defining recesses for holding respective electronic components at intervals along the length of the carrier tape, and a cover tape removably attached to the carrier tape to hold the electronic components in the carrier tape, the feeder further including:

a removal member mounted to the body and extending in a direction transverse to the direction of movement of the tape in the body, the removal member removing the cover tape from the carrier tape and folding the cover tape as the tape advances through the body;

a turning member mounted to the body and defining a groove about its periphery to guide and compact the cover tape;

a wheel rotatably mounted to the body;

an axle rotatably mounted in the body and having one end fixed to the sprocket and an opposite end fixed to the wheel, the sprocket and wheel rotating about the axle;

a lever arm having a first end rotatably mounted to the axle, and a second opposite end; and a roller rotatably mounted to the second end of the lever arm and positioned to oppose the wheel, the cover tape from the turning member passing between and being compressed by the wheel and roller against the carrier tape.

11. An apparatus as claimed in claim 10, wherein the wheel and roller each define two differently sized circumferential surfaces to cause the second wheel to rotate at a faster angular velocity as compared to the feed rate of the tape through the body so that the cover tape is stretched as the cover tape is compressed to the carrier tape between the wheel and the roller.

12. An apparatus as claimed in claim 2, wherein the body includes a cover positioned over at least a portion of the body's guide to enclose the carrier tape in the guide.

13. An apparatus as claimed in claim 12, wherein the feeder further includes:

a cover plate positioned adjacent a portion of the cover, the cover plate coupled to reciprocate with the slider if driven by the base unit so that the cover plate is movable between a first position that is spaced apart from the cover to define a pick-up window through which the pick-up device can extract an electronic component from the tape, and a second position immediately adjacent the cover so that an electronic component advancing in the feeder is blocked from escaping the tape by the presence of the cover plate.

14. An apparatus as claimed in claim 13, wherein the feeder further includes:

a rod having a first end mounted to the slider, for coupling the slider to the cover plate so that the slider and cover plate move together if driven by the base unit.

15. An apparatus as claimed in claim 2, wherein the feeder further includes:

a resilient member coupled between the slider and the body, for biasing the slider to a home position.

16. An apparatus as claimed in claim 2, wherein the base unit further includes:

a controller electrically coupled to receive the signal from the sensor, and generating at least one control signal, based on the sensor signal;

at least one solenoid unit electrically coupled to the controller, the solenoid unit driving the feeder to advance the tape by an interval, based on the control signal.

17. An apparatus as claimed in claim 16, wherein the base unit further includes:

at least one limit switch positioned to detect the position of at least one solenoid unit and generating a signal indicative thereof, the limit switch electrically coupled to output its signal the controller, the controller generating at least one control signal, further based on the signal from the limit switch.

18. An apparatus as claimed in claim 1, wherein the feeder is received by the base unit so as to be movable toward and away from the sensor as the pick-up device applies and releases pressure, respectively, against the feeder to extract an electronic component from the tape.

19. An apparatus as claimed in claim 1, wherein the base unit includes at least one post inserted into at least one respective bore defined in the feeder, the sensor being positioned between in proximity to the post and underneath the feeder if the feeder is positioned on the base unit, so that the feeder can slide on the post to exert pressure on the sensor if the pick-up device exerts pressure against the feeder, and so that the feeder can slide on the post away from the sensor to release pressure on the sensor as the pick-up device moves away from the feeder to extract an electronic component from the tape.

20. An apparatus as claimed in claim 1, wherein the feeder is received by the base unit so as to be freely removable therefrom.

21. A feeder for feeding electronic components positioned at intervals on a tape for extraction by a pick-up device, the feeder driven by a base unit, the feeder comprising:

a body defining a guide to receive the tape, the body defining spaced bores to receive respective spaced posts of the base unit;

a sprocket rotatably mounted in the body, the sprocket having a circumferential edge positioned at least approximately tangential to a surface of the guide upon which the tape is positioned, the circumferential edge of the sprocket having teeth, the teeth extending through perforations defined in the tape;

a slider slidably mounted to reciprocate between first and second positions in the body along a direction that is at least approximately tangential to the sprocket's circumferential edge; and a drive member mounted to the slider, the drive member engaging and rotating the sprocket by an amount sufficient to advance the tape in the guide by an interval if the slider is moved from the first position to the second position, the drive member not rotating the wheel if the slider is moved from the second position to the first position.

22. A feeder as claimed in claim 21, further comprising:

a one-way member fixed to the body and contacting the sprocket, to permit the sprocket to be rotated in only one direction to advance the tape via the drive member and the slider.

23. A feeder as claimed in claim 21, wherein the slider defines a recess that forms a step face adjacent a top surface of the slider, the step face and a portion of the top surface of the slider immediately adjacent the step face positioned between adjacent teeth of the sprocket to prevent the sprocket from rotating if the slider is in the first position.

24. An apparatus as claimed in claim 21, wherein the tape includes a carrier tape defining recesses for holding respective electronic components at intervals along the length of the carrier tape, and a cover tape removably attached to the carrier tape to hold the electronic components in the carrier tape, the apparatus further comprising:

means for removing the cover tape from the carrier tape to expose electronic components for extraction by the pick-up device; and means for compacting the cover tape removed from the carrier tape into a string-like configuration.

25. An apparatus as claimed in claim 21, wherein the tape includes a carrier tape defining recesses for holding respective electronic components at intervals along the length of the carrier tape, and a cover tape removably attached to the carrier tape to hold the electronic components in the carrier tape, the feeder further including:

a removal member mounted to the body and extending in a direction transverse to the direction in which the tape moves through the guide, the cover tape removed from the carrier tape to expose electronic components for extraction by the pick-up device folding over the removal member; and a wheel rotatably mounted to the body and mounted coaxially to the sprocket, the wheel defining a tapered groove about its periphery to receive the cover tape from the removal member and to compact the cover tape into a string-like configuration.

26. An apparatus as claimed in claim 25, wherein the compacted cover tape advances from the wheel between an underside of the carrier tape and the guide defined in the body to exit the feeder for disposal.

27. An apparatus as claimed in claim 25, wherein the body defines a channel to guide the cover tape from the removal member to the wheel.

28. An apparatus as claimed in claim 25, wherein the wheel defines opposing pairs of angled teeth about its peripheral edge positioned on opposite sides of the tapered groove, the teeth of the wheel urging the cover tape to advance and urging the cover tape to move into the relatively narrow bottom portion of the tapered groove to compact the cover tape as the wheel rotates with the sprocket if driven by the slider and the drive member.

29. An apparatus as claimed in claim 21, wherein the tape includes a carrier tape defining recesses for holding respective electronic components at intervals along the length of the carrier tape, and a cover tape removably attached to the carrier tape to hold the electronic components in the carrier tape, the feeder further including:

a removal member mounted to the body and extending in a direction transverse to the direction of movement of the tape in the body, the removal member removing the cover tape from the carrier tape and folding the cover tape as the tape advances through the body;

a turning member mounted to the body and defining a tapered groove about its periphery to guide and compact the cover tape;

a wheel rotatably mounted to the body;

an axle rotatably mounted in the body and having one end fixed to the sprocket and an opposite end fixed to the wheel, the sprocket and wheel rotating about the axle;

a lever arm having a first end rotatably mounted to the axle, and a second opposite end; and a roller rotatably mounted to the second end of the lever arm and positioned to oppose the wheel, the cover tape from the turning member passing between and being compressed by the wheel and roller against the carrier tape.

30. An apparatus as claimed in claim 29, wherein the wheel and roller each define two differently sized circumferential surfaces to cause the second wheel to rotate at a faster angular velocity as compared to the feed rate of the tape through the body so that the cover tape is stretched as the cover tape is compressed to the carrier tape between the wheel and the roller.

31. An apparatus as claimed in claim 21, wherein the body includes a cover positioned over at least a portion of the body's guide to enclose the tape in the guide.

32. An apparatus as claimed in claim 31, wherein the feeder further includes:

a cover plate positioned adjacent to a portion of the cover, the cover plate coupled to reciprocate with the slider if driven to move by the base unit so that the cover plate is movable between a first position that is spaced apart from the cover to define a pick-up window through which the pick-up device can extract an electronic component from the tape, and a second position immediately adjacent the cover so that an electronic component advancing in the feeder is blocked from escaping the tape by the presence of the cover plate.

33. An apparatus as claimed in claim 32, wherein the feeder further includes:

a rod having a first end mounted to the slider and a second end mounted to the cover plate, for coupling the slider to the cover plate so that the slider and cover plate move together if driven to move by the base unit.

34. An apparatus as claimed in claim 21, wherein the feeder further includes:

a resilient member coupled between the slider and the body, for biasing the slider to a home position.

35. An apparatus for feeding tapes for holding electronic components positioned at intervals along the tapes for extraction by at least one pick-up device, the apparatus comprising:

a plurality of feeders for feeding respective tapes, the feeders defining respective spaced bores; and a base unit adapted to receive the feeders, the base unit including a plurality of spaced posts adapted to receive respective feeders in the spaced bores thereof;

a plurality of pressure sensors positioned in association with respective spaced posts to detect exertion of pressure by the pick-up device against the respective feeders as such device moves toward the feeder to extract an electronic component from the tape, and to detect release of pressure exerted by the pick-up device against the respective feeders as such device moves away from the respective feeder to extract the electronic component from the feeders' respective tapes;

a controller electrically coupled to receive the signals from the pressure sensors, and generating at least one control signal, based on the signals from the pressure sensors; and at least one solenoid unit electrically coupled to the controller, the solenoid unit driving the feeders to advance respective tapes by an interval, based on the control signal.

36. An apparatus as claimed in claim 35, wherein the base unit further includes:

at least one limit switch positioned to detect the position of at least one solenoid unit and generating a signal indicative thereof, the limit switch electrically coupled to output its signal the controller, the controller generating at least one control signal, further based on the signal from the limit switch.

37. An apparatus as claimed in claim 36, wherein the apparatus includes
a first solenoid unit having an armature reciprocable between first and second positions in a first direction;
a plurality of second solenoid units coupled to the armature of the first solenoid unit and positioned in proximity to respective feeders, and having respective armatures reciprocable between first and second positions in a second direction transverse to the first direction; and
wherein the apparatus includes at least two limit switches, the first limit switch positioned to detect whether the armature of the first solenoid unit is in its first position and generating a signal indicative thereof, and the second limit switch positioned to detect whether the armature of the first solenoid unit is in the second position and generating a signal indicative thereof,
the controller generating a control signal to move the armature of one of the second solenoid units from its first position to its second position to engage with a particular feeder, if the sensor for the particular feeder indicates that the pick-up device has moved into close proximity with such feeder,
the controller waiting for a predetermined period of time and then generating a control signal to cause the first solenoid unit to move from its first position to its second position to drive the particular feeder to advance its tape by one interval, if the signal from the particular feeder's sensor indicates that the pick-up device has moved away from the particular feeder;
the controller generating a control signal to move the armature of the first solenoid unit from its second position to its first position, if the second limit switch indicates that the armature of the first solenoid unit is in its second position, and
the controller generating a control signal to move the armature of the second solenoid unit for the particular feeder from its second position to its first position to disengage from the respective feeder, if the first limit switch indicates that the armature of the first solenoid unit is at its first position.

38. An apparatus as claimed in claim 37, wherein the feeders each include:
a body defining a guide to receive the tape;
a sprocket rotatably mounted in the body, the sprocket having a circumferential edge positioned at least approximately tangentially to a surface of the guide, the circumferential edge having teeth extending into perforations defined in the tape;
a slider slidably mounted to reciprocate in the body in a direction at least approximately tangential to the circumferential edge of the sprocket; and
a drive member mounted to the slider,
the second solenoid unit for a respective feeder disengaged with the slider in its first position and engaging with the slider in its second position, and
the first solenoid unit driving the slider and drive member to rotate the sprocket by an amount sufficient to advance the tape by one interval if the armature of the first solenoid unit is moved from its first position to its second position, the slider and drive member not rotating the sprocket if the armature of the first solenoid unit moves from the second position to the first position.

39. An apparatus as claimed in claim 35, wherein the feeders are received by the base unit so as to be movable toward and away from respective sensors as the pick-up device applies and releases pressure, respectively, against the feeders to extract an electronic components from their tapes.

40. An apparatus as claimed in claim 35, wherein the feeder is received by the base unit so as to be freely removable therefrom.

41. An apparatus as claimed in claim 35, wherein the base unit includes spaced posts which are inserted into respective bores defined in the feeders, the sensors being positioned adjacent to respective posts and underneath the feeders if the feeders are positioned on the base unit so that the feeders can slide on the posts to exert pressure on respective sensors if the pick-up device exerts pressure on the feeders, and so that the feeders can slide on the posts away from the sensor as the pick-up device moves away from the feeders to extract an electronic component from the tape.

42. An apparatus for feeding at least one tape for holding electronic components positioned at intervals along the tape for extraction by at least one pick-up device, the apparatus comprising:
at least one feeder receiving a tape, the feeder defining spaced bores; and
a base unit having spaced posts received in respective bores of the feeder, the base unit including a pressure sensor positioned in proximity to the feeder if the feeder is positioned on the base unit, the pressure sensor generating a signal that is activated as the pick-up device exerts pressure against the feeder to extract a component from the tape, the pressure sensor deactivating the signal to indicate a release of pressure exerted against the feeder as the pick-up device moves away from the feeder to extract the electronic component from the tape, the base unit driving the feeder to advance the tape by an interval to expose the next electronic component in the tape for extraction by the pick-up device, based on the deactivation of the signal by the pressure sensor.

* * * * *